(12) United States Patent
Katz

(10) Patent No.: US 8,453,022 B2
(45) Date of Patent: May 28, 2013

(54) APPARATUS AND METHODS FOR GENERATING ROW-SPECIFIC READING THRESHOLDS IN FLASH MEMORY

(75) Inventor: Michael Katz, Haifa (IL)

(73) Assignee: Densbits Technologies Ltd., Haifa (IL)

( * ) Notice: Subject to any disclaimer, the term of this patent is extended or adjusted under 35 U.S.C. 154(b) by 444 days.

(21) Appl. No.: 12/596,450

(22) PCT Filed: Sep. 17, 2008

(86) PCT No.: PCT/IL2008/001231
§ 371 (c)(1),
(2), (4) Date: Oct. 19, 2009

(87) PCT Pub. No.: WO2009/072101
PCT Pub. Date: Jun. 11, 2009

(65) Prior Publication Data
US 2010/0131809 A1    May 27, 2010

Related U.S. Application Data

(60) Provisional application No. 60/996,782, filed on Dec. 5, 2007, provisional application No. 61/006,805, filed on Jan. 31, 2008, provisional application No. 61/064,853, filed on Mar. 31, 2008, provisional application No. 61/071,465, filed on Apr. 30, 2008, provisional application No. 61/129,608, filed on Jul. 8, 2008.

(51) Int. Cl.
*G11C 29/00* (2006.01)
*G11C 16/04* (2006.01)

(52) U.S. Cl.
USPC ...................... 714/719; 365/185.33

(58) Field of Classification Search
USPC .... 714/719, 736, 738, 704, 37, 718; 365/201, 365/200, 185.33, 189.011, 230.03
See application file for complete search history.

(56) References Cited

U.S. PATENT DOCUMENTS

| | | |
|---|---|---|
| 4,463,375 A | 7/1984 | Macovski |
| 4,584,686 A | 4/1986 | Fritze |
| 4,589,084 A | 5/1986 | Fling et al. |
| 4,866,716 A | 9/1989 | Weng |
| 5,077,737 A | 12/1991 | Leger et al. |

(Continued)

OTHER PUBLICATIONS

International Search Report and Written Opinion for Application No. PCT/IL2008/001231, dated Jan. 28, 2009.

(Continued)

*Primary Examiner* — Phung M Chung
(74) *Attorney, Agent, or Firm* — Dentons US LLP

(57) ABSTRACT

A method for generating a set of at least one row-specific reading threshold for reading at least portions of pages of data within an erase sector of a flash memory device, the method comprising predetermining at least one initial reading threshold; performing the following steps for at least one current logical page: generating bit error characterizing information regarding at least one corresponding bit error within at least one cell representing at least a logical portion of at least one successfully reconstructed previous logical page; and computing at least one row-specific reading threshold based on said bit error characterizing information and on a previous threshold initially comprising said initial threshold and subsequently comprising a row-specific reading threshold computed for a successfully reconstructed previous logical page; and reading at least a portion of said current logical page using said at least one row-specific reading threshold.

20 Claims, 20 Drawing Sheets

U.S. PATENT DOCUMENTS

| | | |
|---|---|---|
| 5,297,153 A | 3/1994 | Baggen et al. |
| 5,657,332 A | 8/1997 | Auclair et al. |
| 5,729,490 A | 3/1998 | Calligaro et al. |
| 5,793,774 A | 8/1998 | Usui et al. |
| 5,926,409 A | 7/1999 | Engh et al. |
| 5,956,268 A | 9/1999 | Lee |
| 5,982,659 A | 11/1999 | Irrinki et al. |
| 6,038,634 A | 3/2000 | Ji et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,397,697 B2 * | 7/2008 | So et al. ............ 365/185.09 |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 * | 9/2011 | Emma et al. ............ 714/769 |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |

| | | |
|---|---|---|
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1* | 9/2010 | Radke .......................... 714/752 |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published 23-26 May 2004, Volume: 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Serge! Sawitzki, "High-Throughput and Low Power Architectures for Reed Solomon Decoder", (a.kumar at tue.nl, Eindhoven University of Technology and sergei.sawitzki at philips. com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash Eeprom Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell Nrom Reliability", Appears on the website of Saifun.com.
Paulo Cappelletti, Clara Golla, Piero Olivo, Enrico Zanoni, "Flash Memories", Kluwer Academic Publishers, 1999.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF(2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

|     | Even Pages | | | Odd Pages | | |
| --- | --- | --- | --- | --- | --- | --- |
| Row | MSB | CSB | LSB | MSB | CSB | LSB |
| 0 | 0 | 2 | 4 | 1 | 3 | 5 |
| 1 | 6 | 8 | 10 | 7 | 9 | 11 |
| 2 | 12 | 14 | 16 | 13 | 15 | 17 |
| 3 | 18 | 20 | 22 | 19 | 21 | 23 |
| 4 | 24 | 26 | 28 | 25 | 27 | 29 |
| 5 | 30 | 32 | 34 | 31 | 33 | 35 |
| 6 | 36 | 38 | 40 | 37 | 39 | 41 |
| 7 | 42 | 44 | 46 | 43 | 45 | 47 |
| 8 | 48 | 50 | 52 | 49 | 51 | 53 |
| 9 | 54 | 56 | 58 | 55 | 57 | 59 |
| 10 | 60 | 62 | 64 | 61 | 63 | 65 |
| 11 | 66 | 68 | 70 | 67 | 69 | 71 |
| 12 | 72 | 74 | 76 | 73 | 75 | 77 |
| 13 | 78 | 80 | 82 | 79 | 81 | 83 |
| 14 | 84 | 86 | 88 | 85 | 87 | 89 |
| 15 | 90 | 92 | 94 | 91 | 93 | 95 |
| 16 | 96 | 98 | 100 | 97 | 99 | 101 |
| 17 | 102 | 104 | 106 | 103 | 105 | 107 |
| 18 | 108 | 110 | 112 | 109 | 111 | 113 |
| 19 | 114 | 116 | 118 | 115 | 117 | 119 |
| 20 | 120 | 122 | 124 | 121 | 123 | 125 |
| 21 | 126 | 128 | 130 | 127 | 129 | 131 |
| 22 | 132 | 134 | 136 | 133 | 135 | 137 |
| 23 | 138 | 140 | 142 | 139 | 141 | 143 |
| 24 | 144 | 146 | 148 | 145 | 147 | 149 |
| 25 | 150 | 152 | 154 | 151 | 153 | 155 |
| 26 | 156 | 158 | 160 | 157 | 159 | 161 |
| 27 | 162 | 164 | 166 | 163 | 165 | 167 |
| 28 | 168 | 170 | 172 | 169 | 171 | 173 |
| 29 | 174 | 176 | 178 | 175 | 177 | 179 |
| 30 | 180 | 182 | 184 | 181 | 183 | 185 |
| 31 | 186 | 188 | 190 | 187 | 189 | 191 |

Figure 13

|  | Even Pages | | | Odd Pages | | |
|---|---|---|---|---|---|---|
| Row | MSB | CSB | LSB | MSB | CSB | LSB |
| 0 | 0 | 10 | 28 | 1 | 11 | 29 |
| 1 | 2 | 14 | 34 | 3 | 15 | 35 |
| 2 | 4 | 18 | 40 | 5 | 19 | 41 |
| 3 | 6 | 22 | 46 | 7 | 23 | 47 |
| 4 | 8 | 26 | 52 | 9 | 27 | 53 |
| 5 | 12 | 32 | 58 | 13 | 33 | 59 |
| 6 | 16 | 38 | 64 | 17 | 39 | 65 |
| 7 | 20 | 44 | 70 | 21 | 45 | 71 |
| 8 | 24 | 50 | 76 | 25 | 51 | 77 |
| 9 | 30 | 56 | 82 | 31 | 57 | 83 |
| 10 | 36 | 62 | 88 | 37 | 63 | 89 |
| 11 | 42 | 68 | 94 | 43 | 69 | 95 |
| 12 | 48 | 74 | 100 | 49 | 75 | 101 |
| 13 | 54 | 80 | 106 | 55 | 81 | 107 |
| 14 | 60 | 86 | 112 | 61 | 87 | 113 |
| 15 | 66 | 92 | 118 | 67 | 93 | 119 |
| 16 | 72 | 98 | 124 | 73 | 99 | 125 |
| 17 | 78 | 104 | 130 | 79 | 105 | 131 |
| 18 | 84 | 110 | 136 | 85 | 111 | 137 |
| 19 | 90 | 116 | 142 | 91 | 117 | 143 |
| 20 | 96 | 122 | 148 | 97 | 123 | 149 |
| 21 | 102 | 128 | 154 | 103 | 129 | 155 |
| 22 | 108 | 134 | 160 | 109 | 135 | 161 |
| 23 | 114 | 140 | 166 | 115 | 141 | 167 |
| 24 | 120 | 146 | 170 | 121 | 147 | 171 |
| 25 | 126 | 152 | 174 | 127 | 153 | 175 |
| 26 | 132 | 158 | 178 | 133 | 159 | 179 |
| 27 | 138 | 164 | 182 | 139 | 165 | 183 |
| 28 | 144 | 168 | 184 | 145 | 169 | 185 |
| 29 | 150 | 172 | 186 | 151 | 173 | 187 |
| 30 | 156 | 176 | 188 | 157 | 177 | 189 |
| 31 | 162 | 180 | 190 | 163 | 181 | 191 |

Figure 14

| Page | Row | Page | Row | Page | Row | Page | Row | Page | Row | Page | Row |
|---|---|---|---|---|---|---|---|---|---|---|---|
| 0 | 0 | 32 | 5 | 64 | 10 | 96 | 16 | 128 | 21 | 160 | 26 |
| 1 | 0 | 33 | 5 | 65 | 10 | 97 | 16 | 129 | 21 | 161 | 26 |
| 2 | 0 | 34 | 5 | 66 | 11 | 98 | 16 | 130 | 21 | 162 | 27 |
| 3 | 0 | 35 | 5 | 67 | 11 | 99 | 16 | 131 | 21 | 163 | 27 |
| 4 | 0 | 36 | 6 | 68 | 11 | 100 | 16 | 132 | 22 | 164 | 27 |
| 5 | 0 | 37 | 6 | 69 | 11 | 101 | 16 | 133 | 22 | 165 | 27 |
| 6 | 1 | 38 | 6 | 70 | 11 | 102 | 17 | 134 | 22 | 166 | 27 |
| 7 | 1 | 39 | 6 | 71 | 11 | 103 | 17 | 135 | 22 | 167 | 27 |
| 8 | 1 | 40 | 6 | 72 | 12 | 104 | 17 | 136 | 22 | 168 | 28 |
| 9 | 1 | 41 | 6 | 73 | 12 | 105 | 17 | 137 | 22 | 169 | 28 |
| 10 | 1 | 42 | 7 | 74 | 12 | 106 | 17 | 138 | 23 | 170 | 28 |
| 11 | 1 | 43 | 7 | 75 | 12 | 107 | 17 | 139 | 23 | 171 | 28 |
| 12 | 2 | 44 | 7 | 76 | 12 | 108 | 18 | 140 | 23 | 172 | 28 |
| 13 | 2 | 45 | 7 | 77 | 12 | 109 | 18 | 141 | 23 | 173 | 28 |
| 14 | 2 | 46 | 7 | 78 | 13 | 110 | 18 | 142 | 23 | 174 | 29 |
| 15 | 2 | 47 | 7 | 79 | 13 | 111 | 18 | 143 | 23 | 175 | 29 |
| 16 | 2 | 48 | 8 | 80 | 13 | 112 | 18 | 144 | 24 | 176 | 29 |
| 17 | 2 | 49 | 8 | 81 | 13 | 113 | 18 | 145 | 24 | 177 | 29 |
| 18 | 3 | 50 | 8 | 82 | 13 | 114 | 19 | 146 | 24 | 178 | 29 |
| 19 | 3 | 51 | 8 | 83 | 13 | 115 | 19 | 147 | 24 | 179 | 29 |
| 20 | 3 | 52 | 8 | 84 | 14 | 116 | 19 | 148 | 24 | 180 | 30 |
| 21 | 3 | 53 | 8 | 85 | 14 | 117 | 19 | 149 | 24 | 181 | 30 |
| 22 | 3 | 54 | 9 | 86 | 14 | 118 | 19 | 150 | 25 | 182 | 30 |
| 23 | 3 | 55 | 9 | 87 | 14 | 119 | 19 | 151 | 25 | 183 | 30 |
| 24 | 4 | 56 | 9 | 88 | 14 | 120 | 20 | 152 | 25 | 184 | 30 |
| 25 | 4 | 57 | 9 | 89 | 14 | 121 | 20 | 153 | 25 | 185 | 30 |
| 26 | 4 | 58 | 9 | 90 | 15 | 122 | 20 | 154 | 25 | 186 | 31 |
| 27 | 4 | 59 | 9 | 91 | 15 | 123 | 20 | 155 | 25 | 187 | 31 |
| 28 | 4 | 60 | 10 | 92 | 15 | 124 | 20 | 156 | 26 | 188 | 31 |
| 29 | 4 | 61 | 10 | 93 | 15 | 125 | 20 | 157 | 26 | 189 | 31 |
| 30 | 5 | 62 | 10 | 94 | 15 | 126 | 21 | 158 | 26 | 190 | 31 |
| 31 | 5 | 63 | 10 | 95 | 15 | 127 | 21 | 159 | 26 | 191 | 31 |

Figure 15

| Page | Row | Page | Row | Page | Row | Page | Row | Page | Row | Page | Row |
|------|-----|------|-----|------|-----|------|-----|------|-----|------|-----|
| 0 | 0 | 32 | 5 | 64 | 6 | 96 | 20 | 128 | 21 | 160 | 22 |
| 1 | 0 | 33 | 5 | 65 | 6 | 97 | 20 | 129 | 21 | 161 | 22 |
| 2 | 1 | 34 | 1 | 66 | 15 | 98 | 16 | 130 | 17 | 162 | 31 |
| 3 | 1 | 35 | 1 | 67 | 15 | 99 | 16 | 131 | 17 | 163 | 31 |
| 4 | 2 | 36 | 10 | 68 | 11 | 100 | 12 | 132 | 26 | 164 | 27 |
| 5 | 2 | 37 | 10 | 69 | 11 | 101 | 12 | 133 | 26 | 165 | 27 |
| 6 | 3 | 38 | 6 | 70 | 7 | 102 | 21 | 134 | 22 | 166 | 23 |
| 7 | 3 | 39 | 6 | 71 | 7 | 103 | 21 | 135 | 22 | 167 | 23 |
| 8 | 4 | 40 | 2 | 72 | 16 | 104 | 17 | 136 | 18 | 168 | 28 |
| 9 | 4 | 41 | 2 | 73 | 16 | 105 | 17 | 137 | 18 | 169 | 28 |
| 10 | 0 | 42 | 11 | 74 | 12 | 106 | 13 | 138 | 27 | 170 | 24 |
| 11 | 0 | 43 | 11 | 75 | 12 | 107 | 13 | 139 | 27 | 171 | 24 |
| 12 | 5 | 44 | 7 | 76 | 8 | 108 | 22 | 140 | 23 | 172 | 29 |
| 13 | 5 | 45 | 7 | 77 | 8 | 109 | 22 | 141 | 23 | 173 | 29 |
| 14 | 1 | 46 | 3 | 78 | 17 | 110 | 18 | 142 | 19 | 174 | 25 |
| 15 | 1 | 47 | 3 | 79 | 17 | 111 | 18 | 143 | 19 | 175 | 25 |
| 16 | 6 | 48 | 12 | 80 | 13 | 112 | 14 | 144 | 28 | 176 | 30 |
| 17 | 6 | 49 | 12 | 81 | 13 | 113 | 14 | 145 | 28 | 177 | 30 |
| 18 | 2 | 50 | 8 | 82 | 9 | 114 | 23 | 146 | 24 | 178 | 26 |
| 19 | 2 | 51 | 8 | 83 | 9 | 115 | 23 | 147 | 24 | 179 | 26 |
| 20 | 7 | 52 | 4 | 84 | 18 | 116 | 19 | 148 | 20 | 180 | 31 |
| 21 | 7 | 53 | 4 | 85 | 18 | 117 | 19 | 149 | 20 | 181 | 31 |
| 22 | 3 | 54 | 13 | 86 | 14 | 118 | 15 | 150 | 29 | 182 | 27 |
| 23 | 3 | 55 | 13 | 87 | 14 | 119 | 15 | 151 | 29 | 183 | 27 |
| 24 | 8 | 56 | 9 | 88 | 10 | 120 | 24 | 152 | 25 | 184 | 28 |
| 25 | 8 | 57 | 9 | 89 | 10 | 121 | 24 | 153 | 25 | 185 | 28 |
| 26 | 4 | 58 | 5 | 90 | 19 | 122 | 20 | 154 | 21 | 186 | 29 |
| 27 | 4 | 59 | 5 | 91 | 19 | 123 | 20 | 155 | 21 | 187 | 29 |
| 28 | 0 | 60 | 14 | 92 | 15 | 124 | 16 | 156 | 30 | 188 | 30 |
| 29 | 0 | 61 | 14 | 93 | 15 | 125 | 16 | 157 | 30 | 189 | 30 |
| 30 | 9 | 62 | 10 | 94 | 11 | 126 | 25 | 158 | 26 | 190 | 31 |
| 31 | 9 | 63 | 10 | 95 | 11 | 127 | 25 | 159 | 26 | 191 | 31 |

APPARATUS AND METHODS FOR GENERATING ROW-SPECIFIC READING THRESHOLDS IN FLASH MEMORY

CROSS-REFERENCE TO RELATED APPLICATIONS

This application is a National Phase Application of PCT International Application No. PCT/IL2008/001231, entitled "APPARATUS AND METHODS FOR GENERATING ROW-SPECIFIC READING THRESHOLDS IN FLASH MEMORY" International Filing Date Sep. 17, 2008, published on Jun. 11, 2009 as International Publication No. WO 2009/072101, which in turn claim priority from Priority is claimed from U.S. Provisional Application No. 61/129,608, filed Jul. 8, 2008, U.S. Provisional Application No. 60/996,782, filed Dec. 5, 2007, U.S. Provisional Application No. 61/064,853, filed Mar. 31, 2008, U.S. Provisional Application No. 61/006,805, filed Jan. 31, 2008, U.S. Provisional Application No. 61/071,465, filed Apr. 30, 2008, all of which are incorporated herein by reference in their entirety.

REFERENCE TO CO-PENDING APPLICATIONS

Priority is claimed from the following co-pending applications: U.S. Provisional Application No. 61/129,608, filed Jul. 8, 2008 and entitled "A Method for Acquiring and Tracking Detection Thresholds in Flash Devices", U.S. Provisional Application No. 60/996,782, filed Dec. 5, 2007 and entitled "Systems and Methods for Using a Training Sequence in Flash Memory", U.S. Provisional Application No. 61/064,853, filed Mar. 31, 2008 and entitled "Flash Memory Device with Physical Cell Value Deterioration Accommodation and Methods Useful in Conjunction Therewith", U.S. Provisional Application No. 61/006,805, filed Jan. 31, 2008 and entitled "A Method for Extending the Life of Flash Devices" and U.S. Provisional Application No. 61/071,465, filed Apr. 30, 2008 and entitled "Systems and Methods for Temporarily Retiring Memory Portions".

Other co-pending applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/960,943, filed Oct. 22, 2007 and entitled "Systems and methods to reduce errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071,487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to flash memory devices.

BACKGROUND OF THE INVENTION

Conventional flash memory technology is described in the following publications inter alia:
[1] Paulo Cappelletti, Clara Golla, Piero Olivo, Enrico Zanoni, "Flash Memories", Kluwer Academic Publishers, 1999.
[2] G. Campardo, R. Micheloni, D. Novosel, "VLSI-Design of Non-Volatile Memories", Springer Berlin Heidelberg N.Y., 2005.

Other relevant technologies and state of the art systems are described in the following documents:
[3] G. Proakis, "Digital Communications," 3rd ed., New York: McGraw-Hill, 1995.
[4] P. Cappelletti et al., "Flash Memories," Kluwer, 1999.

"Read-disturb" is a known phenomenon whereby following a great many read operations performed on one or more particular physical pages within an erase sector, there is a deterioration in the quality of those physical pages or more typically in the quality of the entire erase sector. Typically, un-programmed cells tend to behave as though they were programmed, causing read errors.

The disclosures of all publications and patent documents mentioned in the specification, and of the publications and patent documents cited therein directly or indirectly, are hereby incorporated by reference.

SUMMARY OF THE INVENTION

The following terms may be construed either in accordance with any definition thereof appearing in the prior art literature or in accordance with the specification, or as follows:

Bit error rate (BER)=a parameter that a flash memory device manufacturer commits to vis a vis its customers, expressing the maximum proportion of wrongly read bits (wrongly read bits/total number of bits) that users of the flash memory device need to expect at any time during the stipulated lifetime of the flash memory device e.g. 10 years.

Block=a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor. n may or may not be an integer. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Cycling: Repeatedly writing new data into flash memory cells and repeatedly erasing the cells between each two writing operations.

Decision regions: Regions extending between adjacent decision levels, e.g. if decision levels are 0, 2 and 4 volts respectively, the decision regions are under 0 V, 0 V-2 V, 2V-4 V, and over 4 V.

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating 2 exp n distinguishable levels of a typically continuous physical value such as charge, where n may or may not be an integer.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or 8.

Logical page: a portion of typically sequential data, whose amount is typically less than or equal to a predetermined amount of data defined to be a pageful of data, which has typically been defined by a host (data source/destination) or user thereof, as a page, and which is sent by the host to a flash memory device for storage and is subsequently read by the host from the flash memory device.

Mapping: basic cell-level writing function in which incoming digital n-tuple is mapped to a program level by inducing a program level in the cell, having a predetermined correspondence to the incoming logical value.

Physical Page=A portion, typically 512 or 2048 or 4096 bytes in size, of a flash memory e.g. a NAND or NOR flash memory device. Writing and reading is typically performed physical page by physical page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages. Alternatively, a physical page is an ordered set (e.g. sequence or array) of flash memory cells which are all written in simultaneously by each write operation, the set typically comprising a predetermined number of typically physically adjacent flash memory cells containing actual data written by and subsequently read by the host, as well as, typically error correction information and back pointers used for recognizing the true address of a page.

Precise read, soft read: Cell threshold voltages are read at a precision (number of bits) greater than the number of Mapping levels ($2^n$). The terms precise read or soft read are interchangeable. In contrast, in "hard read", cell threshold voltages are read at a precision (number of bits) smaller than, or equal to, the number of mapping levels ($2^n$ where n=number of bits per cell).

Present level, Charge level: The amount of charge in the cell. The Amount of charge currently existing in a cell, at the present time, as opposed to "program level", the amount of charge originally induced in the cell (i.e. at the end of programming).

Program: same as "write".

Program level (programmed level, programming level): amount of charge originally induced in a cell to represent a given logical value, as opposed to "present level".

Reliability: Reliability of a flash memory device may be operationalized as the probability that a worst-case logical page written and stored in that device for a predetermined long time period such as 10 years will be successfully read i.e. that sufficiently few errors, if any, will be present in the physical page/s storing each logical page such that the error code appended to the logical page will suffice to overcome those few errors.

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Resolution: Number of levels in each cell, which in turn determines the number of bits the cell can store; typically a cell with $2^{\wedge}An$ levels stores n bits. Low resolution (partitioning the window, W, of physical values a cell can assume into a small rather than large number of levels per cell) provides high reliability.

Retention: Retention of original physical levels induced in the flash memory cells despite time which has elapsed and despite previous erase/write cycles; retention is typically below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Symbol: Logical value

Threshold level or "decision level": the voltage (e.g.) against which the charge level of a cell is measured. For example, a cell may be said to store a particular digital n-tuple D if the charge level or other physical level of the cell falls between two threshold values T.

Code rate: ratio of redundancy bits to data bits in flash memory.

Data cells: cells storing data provided by host as opposed to "non-data cells" which do not store host-provided data, and may, for example, store instead error correction information, management information, redundancy information, spare bits or parity bits.

Logical page: a set of bits defined as a page typically having a unique page address, by a host external to a flash memory device.

In the present specification, the terms "row" and "column" refer to rows of cells and columns of cells, respectively and are not references to sub-divisions of a logical page.

The term "MSB" is used herein to denote the bit which is programmed into a multi-level cell, storing several bits, first. The term "LSB" is used herein to denote the bit which is programmed into the multi-level cell, last. The term "CSB" is used herein to denote the bit which is programmed into a 3-level cell, storing 3 bits, second, i.e. after the MSB and before the LSB. It is appreciated that more generally, e.g. if the multi-level cell stores 4 or more levels, there are more than one CSBs and use of the term "CSB" herein, which implies that the cell is a 3-level cell, is merely by way of example and is not intended to be limiting.

A logical page is a set of bytes which is meaningful to an application. The location of a logical page in memory is termed herein a physical page. This location may comprise certain cells in their entirety, or, more commonly, may comprise only one or some bits within certain cells. The locations of each of a sequence of logical pages (page 0, page 1, page 2, . . . ) within memory is pre-determined by a suitable mapping scheme mapping logical pages into the bits of the cells of a particular erase sector (block) in flash memory.

"Successfully reconstructed" means that using error correction code, the original logical page has been reconstructed generally satisfactorily, e.g., typically, that the logical page has been read, using reading thresholds, has undergone error correction as appropriate and has successfully passed its CRC (cyclic redundancy check) criterion.

"Bit errors" are those errors found in the physical page corresponding to a logical page, which typically are corrected using ECC (error correction code) such that the page is successfully reconstructed despite these errors.

The term "reading threshold" and "detection threshold" are used generally interchangeably.

The term "directed threshold errors" refers to events in which a cell which was programmed to one program level is erroneously interpreted, upon performing a read operation, as being programmed to another program level. A directed threshold error is described by stating the index of the threshold lying between the cell's program level and the erroneously read program level and which is closest to the cell's actual program level, as well as the direction of the error, i.e. "right to left" if the cell was misinterpreted as being programmed to a program level residing to the left of the cell's program level, and "left to right" if the cell was misinterpreted as being programmed to a program level residing to the right of the cell's program level.

Certain embodiments of the present invention seek to provide improved flash memory device.

Certain embodiments of the present invention seek to provide inference methods in Flash Memory Devices based on analysis of bit error patterns.

Certain embodiments of the present invention seek to provide a method for correcting at least one detection threshold for reading the data of at least one page within an erase sector of a flash memory device, the method comprising associating the bit errors of at least one previous successfully read page to corresponding directed threshold errors and choosing a corrected threshold based on the previous detection threshold and number of the directed threshold errors.

Certain embodiments of the present invention seek to provide a method for associating at least one bit error of at least one successfully decoded page within an erase sector of a flash device to a corresponding directed threshold error.

Certain embodiments of the present invention seek to provide a method for performing tracking of at least one detection threshold for reading the data of at least one page within an erase sector of a flash memory device wherein previously decoded pages are used.

Certain embodiments of the present invention seek to provide a method for identifying read disturb in at least one erase sector of a flash memory device wherein at least one previously decoded page is used.

There is thus provided, in accordance with certain embodiments of the present invention, a method for generating a set of at least one row-specific reading threshold for reading at least portions of pages of data within an erase sector of a flash memory device, the method comprising predetermining at least one initial reading threshold, performing the following steps for at least one current logical page: generating bit error characterizing information regarding at least one corresponding bit error within at least one cell representing at least a logical portion of at least one successfully reconstructed previous logical page; and computing at least one row-specific reading threshold based on the bit error characterizing information and on a previous threshold initially comprising the initial threshold and subsequently comprising a row-specific reading threshold computed for a successfully reconstructed previous logical page; and reading at least a portion of the current logical page using the at least one row-specific reading threshold.

It is appreciated that the above row-specific method is performed locally, i.e. for local regions within a flash memory device being read, e.g. for each row in the flash memory, or for some individual rows, or for each of a number of sets each comprising a relatively small number of typically adjacent rows.

According to certain embodiments of the present invention the number of threshold errors from left to right with respect to the detection threshold is compared to the number of threshold errors from right to left with respect to the detection threshold, wherein the corrected detection threshold is modified according to the sign and magnitude of the difference between the two numbers of threshold errors.

According to certain embodiments of the present invention, the number of directional threshold errors with respect to at least one detection threshold in the page is used to determine if the erase sector suffers from read disturb.

According to certain embodiments of the present invention the detection thresholds are corrected only for a subset of pages in the erase sector wherein the subset of pages is chosen such that the correction will be done on detection thresholds which were used on a subset of rows within an erase sector.

According to certain embodiments of the present invention thresholds are corrected only if the difference between the total error count associated with the decoding of the page and the total error count associated with the decoding of the previous page is larger than some number.

According to certain embodiments of the present invention the association between bit errors and threshold errors in CSB and/or LSB pages is done based on reading the corresponding MSB and/or CSB pages from the flash device.

According to certain embodiments of the present invention the association is done based on the corresponding MSB and/or CSB pages which are stored in a buffer.

Further in accordance with certain embodiments of the present invention, the bit error characterizing information comprises identification of a reading threshold associated with the bit error.

Still further in accordance with certain embodiments of the present invention, the bit error characterizing information comprises a direction of the bit error.

It is appreciated that a reading threshold is associated with each bit error in that a wrong logical value is assigned to a bit when a physical value induced in the cell in which the bit resides, falls so far along one of the two tail ends of the voltage (e.g.) distribution of the logical value as to exceed the upper threshold of the programmed value or so as to fall below the lower threshold of the programmed value. In the first instance, the upper threshold is associated with the bit error and the direction of the bit error is termed "left to right". In the second instance, the lower threshold is associated with the bit error and the direction of the bit error is termed "right to left".

Still further in accordance with certain embodiments of the present invention, a first number of threshold errors whose direction, with respect to the reading threshold, is from left to right is compared to a second number of threshold errors whose direction, with respect to the reading threshold, is from right to left, wherein the row-specific reading threshold depends upon at least one of the sign and magnitude of the difference between the first and second numbers of threshold errors.

Further in accordance with certain embodiments of the present invention, the method also comprises selecting a subset of rows within the erase sector; identifying a set of logical pages residing within the subset of rows; and performing the generating, computing and reading for the set of logical pages and for less than all pages in the erase sector.

Still further in accordance with certain embodiments of the present invention, the generating, computing and reading are performed only for the set of logical pages.

Additionally in accordance with certain embodiments of the present invention, the reading thresholds are corrected only if the number of bit errors per page is in a process of change of at least a predetermined magnitude.

Further in accordance with certain embodiments of the present invention, the reading thresholds are corrected only if the difference between the number of bit errors encountered during reconstruction of the current page and the number of bit errors occurring during reconstruction of at least one previous page is larger than a predetermined number.

The predetermined number is typically selected to be relatively large so that the reading threshold correction process is only initiated when a very significant rise in bit error frequency is detected. For example, if the page size is, say, 4 K bytes, an increase in the number of bit errors per page of the order of magnitude of dozens or hundreds of bit errors might trigger a reading threshold correction process such as those shown and described herein.

Further in accordance with certain embodiments of the present invention, the generating is performed for at least one CSB page residing in a row corresponding to an MSB page also residing in the row, based at least partly on values read from the MSB page.

Additionally in accordance with certain embodiments of the present invention, the generating is performed for an LSB page residing in a row corresponding to an MSB and at least one CSB page also residing in the row, based at least partly on values read from at least one of the MSB and CSB pages.

Further in accordance with certain embodiments of the present invention, the generating performed for the CSB page is based at least partly on values read on-the-fly from the MSB page.

Still further in accordance with certain embodiments of the present invention, the generating performed for the LSB page is based at least partly on values read on-the-fly from at least one of the MSB and CSB pages.

Additionally in accordance with certain embodiments of the present invention, the generating performed for the CSB page is based at least partly on stored values previously read from the MSB page.

Further in accordance with certain embodiments of the present invention, the generating performed for the LSB page is based at least partly on stored values previously read from at least one of the MSB and CSB pages.

It is appreciated that the values read from the MSB and/or CSB pages may be read from a buffer which stored these pages, perhaps when they were originally read, or may be a re-read of a page which has already been read at least once either only for reading its own data, or also in order to perform the teachings of this invention, say, for a CSB page preceding the current page which is an LSB page. The buffer is typically located within a controller external to a flash memory device although alternatively it may be located within an internal controller.

Also provided, in accordance with another embodiment of the present invention, is a method for using flash memory to store data, the method comprising writing at least one page of data to the flash memory, reading the at least one page of data from the flash memory using a set of reading thresholds, including generating bit error characterizing information regarding at least one corresponding bit error within at least one cell representing at least a logical portion of at least one successfully reconstructed previous logical page; and subsequently, using the flash memory so as to take into account the bit error characterizing information.

Further in accordance with certain embodiments of the present invention, the bit error characterizing information comprises identification of a reading threshold which is associated with the bit error.

Still further in accordance with certain embodiments of the present invention, the bit error characterizing information comprises a direction of the bit error.

Additionally in accordance with certain embodiments of the present invention, the using comprises reading at least one subsequent page of data so as to take into account the bit error characterizing information.

Further in accordance with certain embodiments of the present invention, the using comprises detecting portions of the flash memory which suffer from read-disturb phenomenon based on the bit error characterizing information.

It is appreciated that typically, portions of the flash memory which suffer from read-disturb phenomenon are detected rather than merely deducing that a particular portion of memory, e.g. erase sector, suffers from the phenomenon based on the number of times that portion, or a sub-portion e.g. page within it, has been read.

Further in accordance with certain embodiments of the present invention, the detecting comprises detecting an overly large number of bit errors whose source is a reading threshold which is closest, within the set of reading thresholds, to zero voltage, and whose direction is from left to right.

Also provided, in accordance with another embodiment of the present invention, is a system for generating a set of at least one row-specific reading threshold for reading at least portions of pages of data within an erase sector of a flash memory device, the system comprising apparatus for predetermining at least one initial reading threshold; a bit error analyzer operative, for at least one current logical page, to generate bit error characterizing information regarding at least one corresponding bit error within at least one cell representing at least a logical portion of at least one successfully reconstructed previous logical page; and a bit error-based threshold generator operative to compute at least one row-specific reading threshold based on the bit error characterizing information and on a previous threshold initially comprising the initial threshold and subsequently comprising a row-specific reading threshold computed for a successfully reconstructed previous logical page; and a flash memory cell reader operative to read at least a portion of the current logical page using the at least one row-specific reading threshold.

Further provided, in accordance with yet another embodiment of the present invention, is a system for using flash memory to store data, the system comprising apparatus for writing in flash memory operative to write at least one page of data to the flash memory; a bit error characterizing reader operative to read the at least one page of data from the flash memory using a set of reading thresholds, including generating bit error characterizing information regarding at least one corresponding bit error within at least one cell representing at least a logical portion of at least one successfully reconstructed previous logical page; and a bit error-based controller operative to control the flash memory so as to take into account the bit error characterizing information.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings:

FIG. 13 is a table comprising a mapping between logical pages and physical pages which is useful in understanding certain embodiments of the present invention;

FIG. 14 is a table comprising another mapping between logical pages and physical pages which is useful in understanding certain embodiments of the present invention;

FIG. 15 is a look-up-table based on the mapping in FIG. 13 which associates for each page index the corresponding row index where the logical page resides, and which is useful in understanding certain embodiments of the present invention;

FIG. 16 is a look-up-table based on the mapping in FIG. 14 which associates for each page index the corresponding row index where the logical page resides, and which is useful in understanding certain embodiments of the present invention;

DETAILED DESCRIPTION OF CERTAIN EMBODIMENTS

In the present specification, the terms "row" and "column" as used herein are intended to include rows of cells and columns of cells, respectively and are not references to sub-divisions of a logical page.

The term "MSB" as used herein is intended to include the bit which is programmed into a multi-level cell, storing several bits, first. The term "LSB" as used herein is intended to include the bit which is programmed into the multi-level cell, last. The term "CSB" as used herein is intended to include the bit which is programmed into a 3-level cell, storing 3 bits, second, i.e. after the MSB and before the LSB. It is appreciated that more generally, e.g. if the multi-level cell stores 4 or more levels, there are more than one CSBs and use of the term "CSB" herein, which implies that the cell is a 3-level cell, is merely by way of example and is not intended to be limiting.

A logical page as used herein is intended to include a set of bytes which is meaningful to an application. The location of a logical page in memory is termed herein a physical page. This location may comprise certain cells in their entirety, or, more commonly, may comprise only one or some bits within certain cells. The locations of each of a logical sequence of logical pages (page 0, page 1, page 2, . . . ) within memory is pre-determined by a suitable mapping scheme mapping logical pages into the bits of the cells of a particular erase sector (block) in flash memory.

"Successfully reconstructed" as used herein is intended to include situations in which, using error correction code, the original logical page has been reconstructed generally satisfactorily, e.g., typically, that the logical page has been read, using reading thresholds, has undergone error correction as appropriate and has successfully passed its CRC (cyclic redundancy check) criterion.

"Bit errors" as used herein is intended to include those errors found in the physical page corresponding to a logical page, which typically are corrected using ECC (error correction code) such that the page is successfully reconstructed despite these errors.

The terms "reading threshold" and "detection threshold" are used generally interchangeably.

Figure 1:
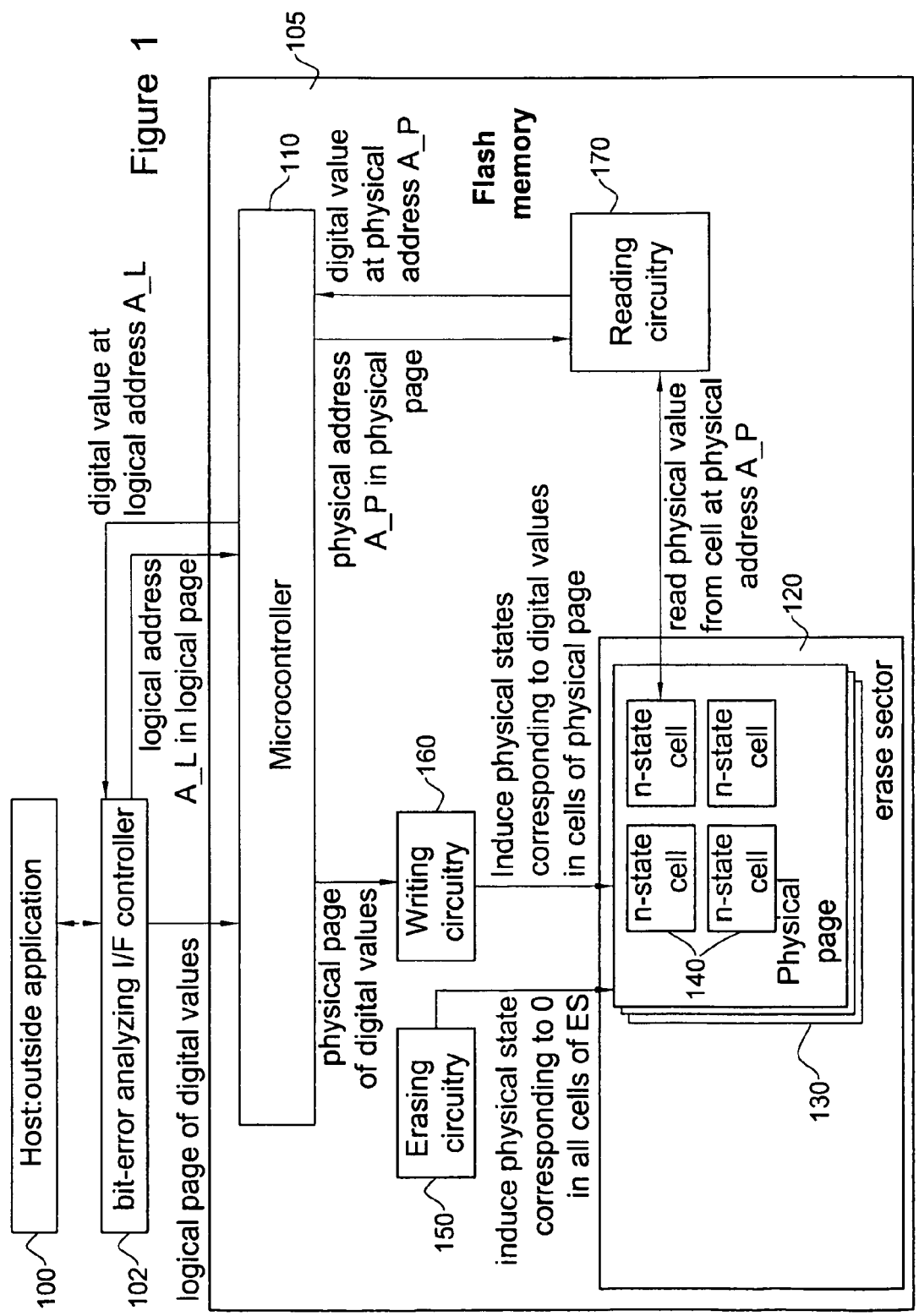
FIG. 1 is a simplified block diagram of a flash memory system constructed and operative in accordance with certain embodiments of the present invention.

Reference is now made to FIG. 1 which is a simplified block diagram of a flash memory system constructed and operative in accordance with certain embodiments of the present invention. As shown, the flash memory system of FIG. 1 includes a host or outside application 100 which interfaces, via an interface controller 102, with a flash memory device 105. An internal microcontroller 110 typically manages the functional units of the flash memory device 105. The storage portion of the flash memory device includes one or more typically many erase sectors 120 each storing one or more typically many physical pages 130 each including one or more typically many cells 140 having more than one possible state such that logical values may be stored therein. Erasing circuitry 150 is provided to erase data from cells, writing circuitry 160 writes data into cells, and reading circuitry 170 reads data from cells.

A particular feature of the system shown in FIG. 1 by way of example is the bit-error analyzing functionalities of the I/F controller 102 and/or of the internal micro-controller 110.

Figure 2:
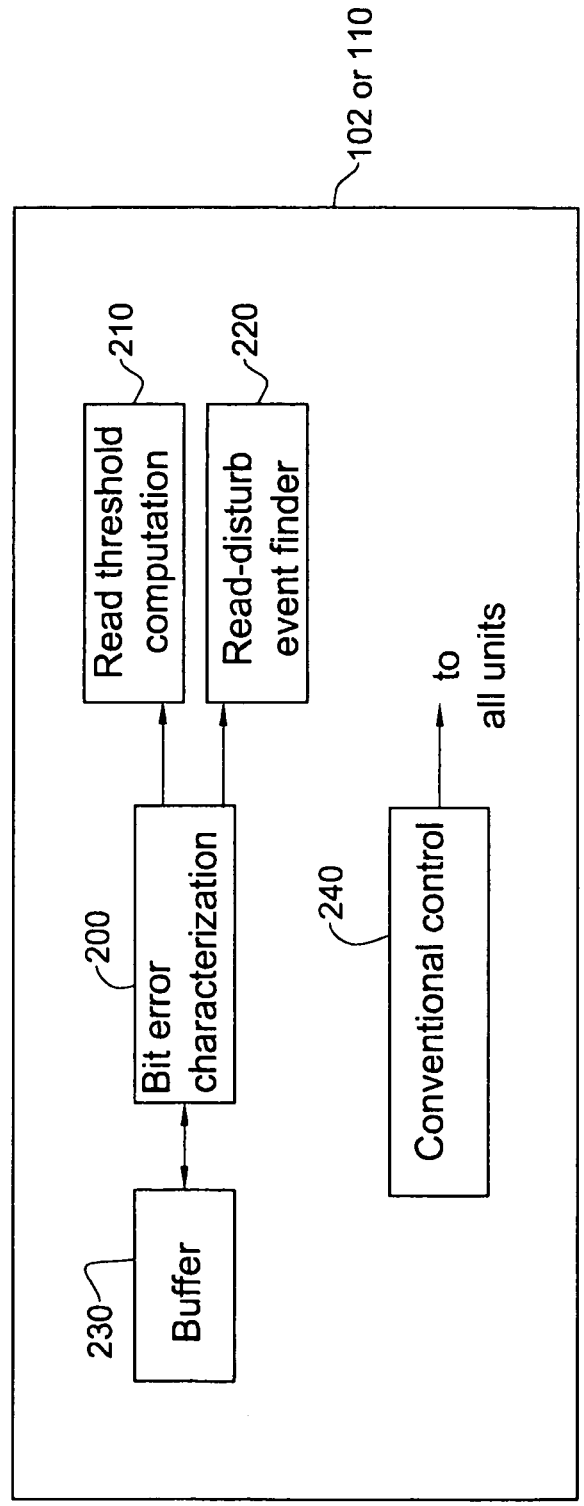
FIG. 2 is a simplified functional block diagram illustration of the bit-error analyzing controller 102 of FIG. 1, according to certain embodiments of the present invention.

FIG. 2 is a simplified functional block diagram illustration of the bit-error analyzing controller 102 of FIG. 1, according to certain embodiments of the present invention. As shown, the controller 102 may include a bit error characterization block 200 which provides information regarding bit errors' characteristics, particularly joint characteristics, to application functionalities such as but not limited to a read threshold computation unit 210 and/or a read-disturb event finder 220. Optionally, a buffer 230 is provided which is useful for reading MSB and CSB pages as described in detail herein. The buffer 230 serves the characterizer of bit errors 200 which in turn serves read threshold computation unit 210 and/or read-disturb event finder 220.

Figure 18:
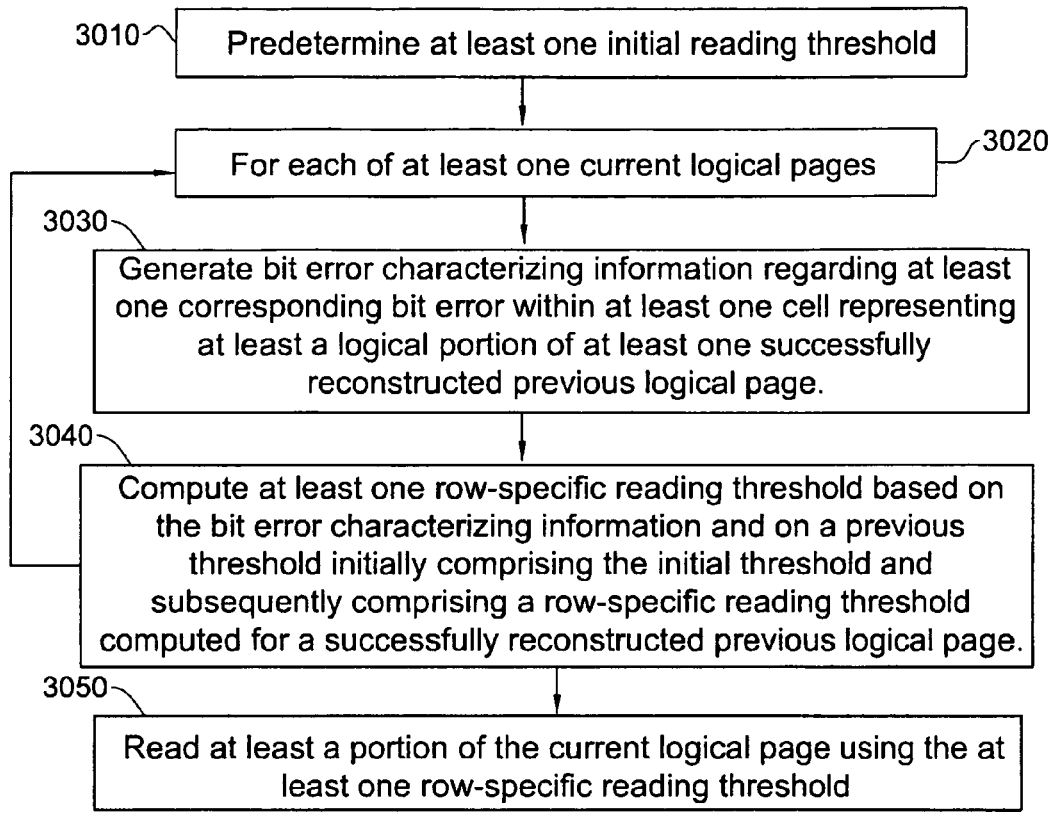
FIG. 18 is a generalized flowchart illustration of a method of operation of the system of FIGS. 1-2, the method being operative according to certain embodiments of the present invention.

The system of FIGS. 1-2 is particularly suitable for generating a set of at least one row-specific reading threshold for reading at least portions of pages of data within an erase sector of a flash memory device. This method may comprise some or all of the following steps, as shown in FIG. 18:

Step 3010: predetermining at least one initial reading threshold

Step 3020: performing steps 3030 and 3040 for each of at least one current logical pages.

Step 3030: generating bit error characterizing information regarding at least one corresponding bit error within at least one cell representing at least a logical portion of at least one successfully reconstructed previous logical page.

Step 3040: computing at least one row-specific reading threshold based on the bit error characterizing information and on a previous threshold initially comprising the initial threshold and subsequently comprising a row-specific reading threshold computed for a successfully reconstructed previous logical page.

Step 3050: When steps 3030 and 3040 have been performed for a set of current logical pages, step 3050 is performed, involving reading at least a portion of the current logical page using the at least one row-specific reading threshold.

Figure 3:
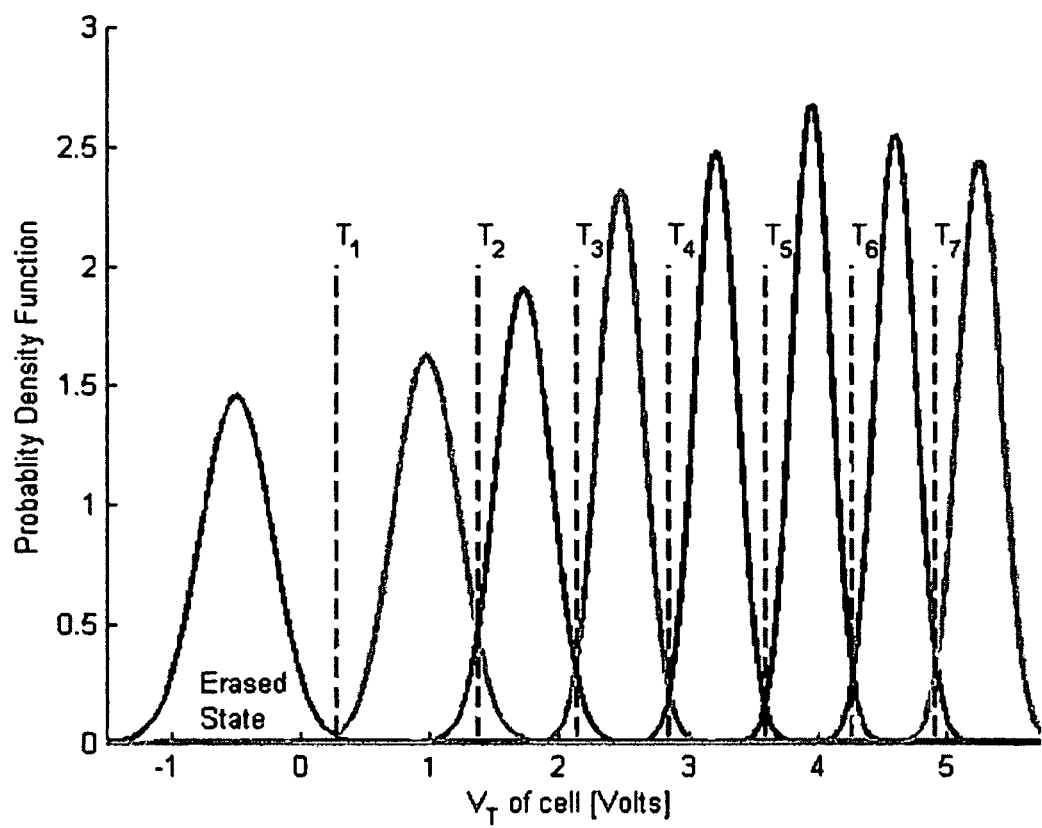
FIG. 3 is a theoretical graph of voltage distributions conditional on program levels which is useful in understanding certain embodiments of the present invention.

Conventionally, flash memory devices store information as charge in "cells", each made of either a floating gate transistor or an NROM transistor. In single-level cell (SLC) devices, each cell stores only one bit of information. Multi-level cell (MLC) devices can store more than one bit per cell by choosing between multiple levels of electrical charge to apply to the floating gates of their cells. The amount of charge (also known as charge level) is then measured by a detector, by comparing the voltage of the transistor gate (also known as charge level and denoted $V_T$) to a decision threshold voltage (also known as charge level boundary point and denoted $V_D$). The amount of charge is then used to determine the programmed level (logical value) of the cell. Due to inaccuracies during the programming procedure and charge loss due to time and temperature (also known as retention), the measured levels suffer from a random distortion. Prior art FIG. 3 illustrates an example of the eight separate probability distributions of a cell which can be programmed with one of eight corresponding program levels (111, 110, 100, 101, 001, 000, 010, and 011, respectively). For each distribution curve, the Y-axis represents the probability that the cell is programmed to the corresponding level, given the value of the charge level $V_T$ (represented by the x-axis).

A particular feature of certain embodiments of the present invention, is that changes in the distributions of the programming lobes illustrated in FIG. 3 are tracked between pages, using a suitable indicator of such changes such as bit error characteristics including associated threshold and direction of each bit error, all as described in detail below.

The cell's programmed level may be determined using several methods. One method is to apply a voltage to the cell's gate and measure if the cell conducts current. The cell has a certain threshold voltage such that if voltage above that threshold is applied to the gate, the gate will conduct. Below that threshold voltage the gate will not conduct current (or will conduct a small amount of current, below a certain demarcation level). As the amount of charge in the cell changes this threshold voltage, the charge may be inferred by determining at which voltage the cell starts to conduct current. Thus, the programmed level is determined by iteratively applying different voltages to the gate and measuring whether the cells conduct or not. Another method is based on the fact that when applying a voltage above the threshold voltage, the cell conducts current and the amount of current depends on the difference between the applied voltage and the threshold voltage. As the threshold voltage changes as a function of the amount of charge in the cell, the programmed level may be inferred by measuring the current going through the cell.

Thus, the programmed level may be obtained by simultaneously comparing the conducted current with a given set of fixed currents distinguishing between all programmed levels. In other words, each cell's programmed level is determined by simultaneously comparing the $V_T$ level against several decision threshold levels (detection thresholds). For example, if there are eight possible programmed levels, the cell's $V_T$ is simultaneously compared against seven decision threshold levels which divide the voltage axis into eight regions, as demonstrated in FIG. 3.

In general, if there are L possible program levels, then L−1 decision threshold levels are employed. As the probability distributions extend beyond the decision threshold levels, there is a probability of detection error, i.e. detecting the wrong program level. In order to minimize the detection error, one wishes to set the decision threshold levels optimally. The optimal placement of the decision thresholds levels in terms of minimizing the detection error probability generally depends on the probability distribution associated with the $V_T$ level of the cells. The statistical behavior of the cells' $V_T$ level can be approximated by Gaussian distributions. The optimal placement of the detection threshold for the Gaussian case is a known function of the means and standard deviations (STDs) of the Gaussian distributions. In other words, knowledge of good decision thresholds (assuming the Gaussian assumption is correct) is possible if the means and STDs of the cells' $V_T$ distributions are known.

Since the means and STDs of the probability distributions change as a result of cycling and retention, it is not clear how to set the decision thresholds when attempting to read a given page storing information. Setting the decision thresholds to the optimal position corresponding to a fresh device might show acceptable performance only if the page was recently programmed and not retained for a significant amount of time. Similarly, setting the decision thresholds to fit a device which was cycled 1000 times and retained for 10 years might not work, i.e. cause too many detection errors, if the page in question was recently written to a non-cycled flash device.

In some applications, this situation calls for a training stage in which the flash device's controller learns the "state" of the page/block and determines a set of decision thresholds which will yield preferably as little detection errors as possible when used to read the page.

Since some variations exist in the statistics of the program levels between different blocks within one flash device, and between different pages within one erase sector, it is appreciated that one cannot hope to find a single choice of thresholds which will be appropriate, i.e. yield a sufficiently high uncoded bit error rate (UBER), for all the pages in the flash device. One solution is to use the training process for every page to be read, or for every page for which it is suspected that the detection thresholds previously obtained are not sufficiently accurate. Depending on the complexity of the training process, such a solution might be too costly, and might jeopardize the feasibility of certain flash applications.

Certain embodiments of this invention include a way for adapting the detection thresholds from one page to the next in such a way which considerably limits the number of training operations employed to read an entire population of blocks of a flash device. The adaptation is done either without or with very little additional reading operations from the flash device.

In certain embodiments, the adaptation is done based on the bit error pattern obtained after successful decoding of the error correcting code (ECC).

The embodiment described above also has applications for coping with read disturb. Read disturb is a situation where the voltages applied to the row and column of a target memory floating gate cell in order to perform the read operation, cause unwanted programming to erased cells which lie on the same column as the target cell. This unwanted programming accumulates over time after successive read operations to the degree of causing cells in the erased state to be in programmed states.

Certain embodiments of this invention use the bit error patterns to identify a block which is suffering from a severe read disturb and if left unchanged might reach a state where the data stored in it becomes undetectable.

Also described herein are variations on the above embodiments which account for performance trade-offs.

According to certain embodiments of the present invention, tracking of the changes in the detection thresholds which occur between successive pages in a flash array is provided. The tracking is performed by analyzing the asymmetry between errors which occur due to cells' $V_1$ levels crossing the detection thresholds from left to right and errors which occur due to cells' $V_T$ levels crossing the detection thresholds from right to left. The detection thresholds are modified according to the sign and magnitude of the difference between the two types of threshold errors. The tracking operation guarantees that detection thresholds adapt to the changes in the threshold voltage distributions without the need to perform multiple training procedures which may be costly in terms of flash read operations.

Certain embodiments of this invention seek to perform the above functionalities in a manner which saves processing time e.g. by performing the tracking procedure only for certain rows/pages within an erase sector, and/or by performing the tracking procedure only when the total number of errors increases drastically with respect to previous rows/pages. Certain embodiments of this invention seek to perform the above functionalities in a manner which saves memory requirements e.g. by performing read operations from the flash "on the fly" in order to associate bit errors to the threshold errors.

Certain embodiments of this invention seek to identify erase sectors which suffer from read disturb. This is done by identifying erased cells which have become programmed due to repetitive read operations. A threshold error association mechanism is used here to identify programming of erased cells by checking the number of directed threshold errors from left to right with respect to the detection threshold closest to the erased level.

By way of example, consider a floating gate flash memory device where each cell has 8 possible charge levels (or program levels), thus storing 3 bits per cell. That said, certain embodiments of this invention are also applicable to NROM flash devices and/or flash devices with less or more charge levels. The page to be read has been written to a flash device after an unknown number of program/erase cycles, and the data in the page was retained for an unknown period of time. Denote the number of cells in the page by $N_c$. Denote the means of the cells' $V_T$ level distributions by $\mu_1, \mu_2, \ldots, \mu_8$, where the index 1 corresponds to the erase level, index 2 corresponds to the program level closest to the erased state, and so on. Furthermore, denote by $\sigma_1, \sigma_2, \ldots, \sigma_8$ the standard deviations (STDs) of these distributions, respectively. Finally, denote by $T_1, T_2, \ldots, T_7$ the detection thresholds which are to be used for reading the page. An approximation to the optimal detection thresholds is given by the following formula:

$$T_k = \frac{\sigma_{k+1}\mu_k + \sigma_k\mu_{k+1}}{\sigma_k + \sigma_{k+1}}, k = 1, 2, \ldots, 7.$$

Tracking of Detection Thresholds according to certain embodiments of the present invention is now described in detail.

In many occasions, the pages of one block are read sequentially. When examining the threshold voltage distributions of the pages in one block, it is observed that some variations occur from page to page. In some situations, the total variations across the rows of a single block can be comparatively large. This implies that employing the same detection thresholds for reading all the pages of the block will result in too many errors, which the error correcting code will not be able to correct.

One solution is to perform a training procedure for every row in the block. This approach might be less favorable due to the potential delay inherent to the training process. A low cost alternative is described herein which need not employ any extra reading operations from the flash other than those which actually read the page.

Figures 4A, 4B, 4C:
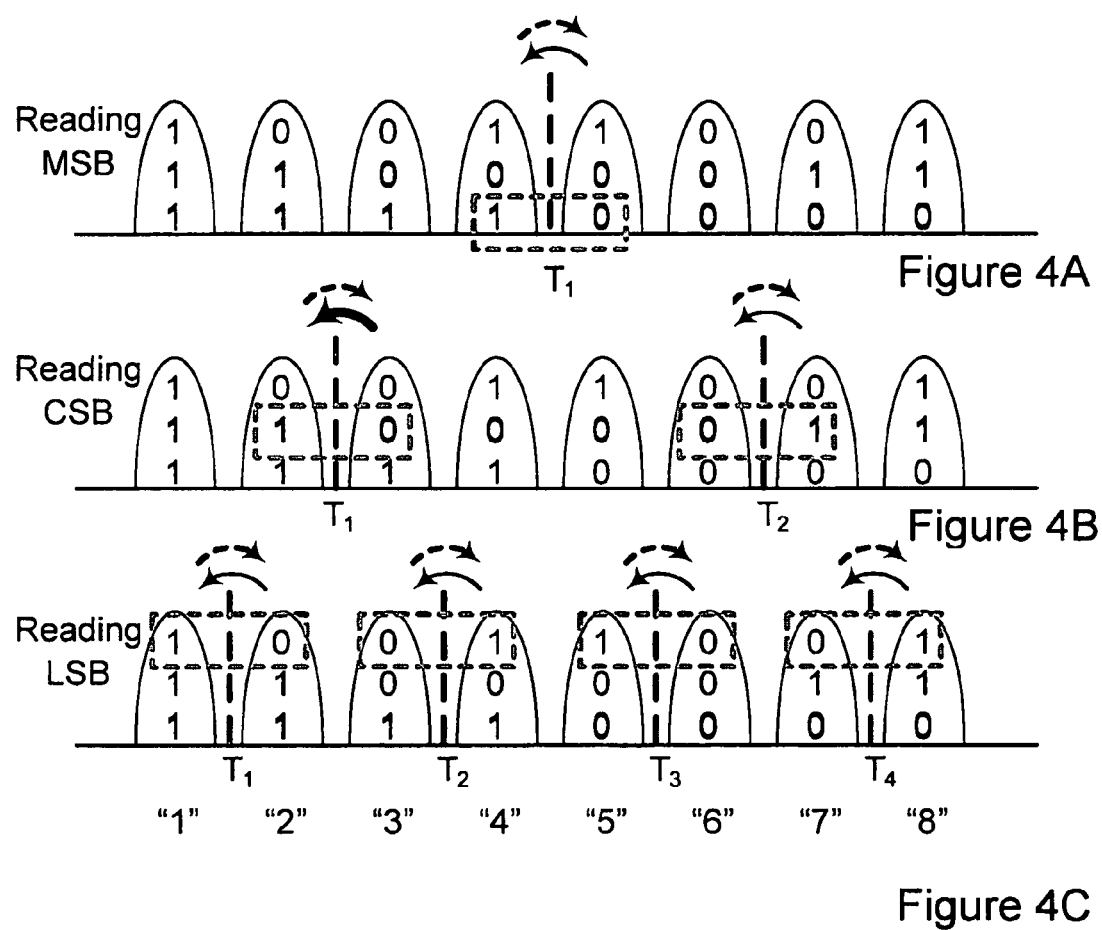
FIG. 4A-4C, taken together, are a diagram depicting mapping from data bits to program levels and threshold crossover errors which is useful in understanding certain embodiments of the present invention.

In the example shown and described herein, the mapping between data bits and cell program levels is depicted in prior art FIG. 4. Each combination of bits corresponding to a specific selection of MSB, CSB, and LSB is mapped to one of eight program levels as shown in FIG. 4. The dashed vertical lines mark the reading thresholds. In order to read the MSB, a single threshold is used. Cells which conduct current when this threshold is applied to their gate are interpreted as having their MSB equal to 1, while the remaining cells are identified as having their MSB equal 0. The reading of the CSB employs two thresholds. Cells which conduct when the left threshold is applied to them and cells which do not conduct (even) if the right threshold is applied to them are identified as having their CSB equal 1, while the cells which do not conduct when the left threshold is applied to them but conduct current when the right threshold is applied to them are interpreted as having their CSB equal 0. For the LSB, four thresholds are employed. Cells whose $V_T$ lies between $T_1$ and $T_2$ or between $T_3$ and $T_4$ are interpreted as having their LSB equal 0, while for the remaining cells, the LSB is read as 1.

The curved arrows above each detection threshold designate errors resulting from threshold voltages of some cells appearing in the detection regions of their neighboring cells. For example, assume a cell was programmed to level 3, but due to programming error and/or retention effects, the actual threshold voltage at the time the cell is to be read is just to the left of $T_1$ in the second graph of FIG. 4. When $T_1$ is applied to this cell, it will conduct current and its CSB bit will be erroneously interpreted as a 1 even though its CSB was 0. Such an error event is marked by the bold solid curved arrow above $T_1$ in the second graph of FIG. 4. Similarly, the remaining dashed curved arrows designate threshold errors from left to right, while the solid arrows mark errors from right to left. These threshold errors are termed herein "directed threshold errors".

The tracking process is based on the assumption that when the thresholds are not optimally placed, e.g. due to the shifting of the means of the program levels between successive rows, an asymmetry is present between the errors from left to right and the errors from right to left.

Figure 5A:
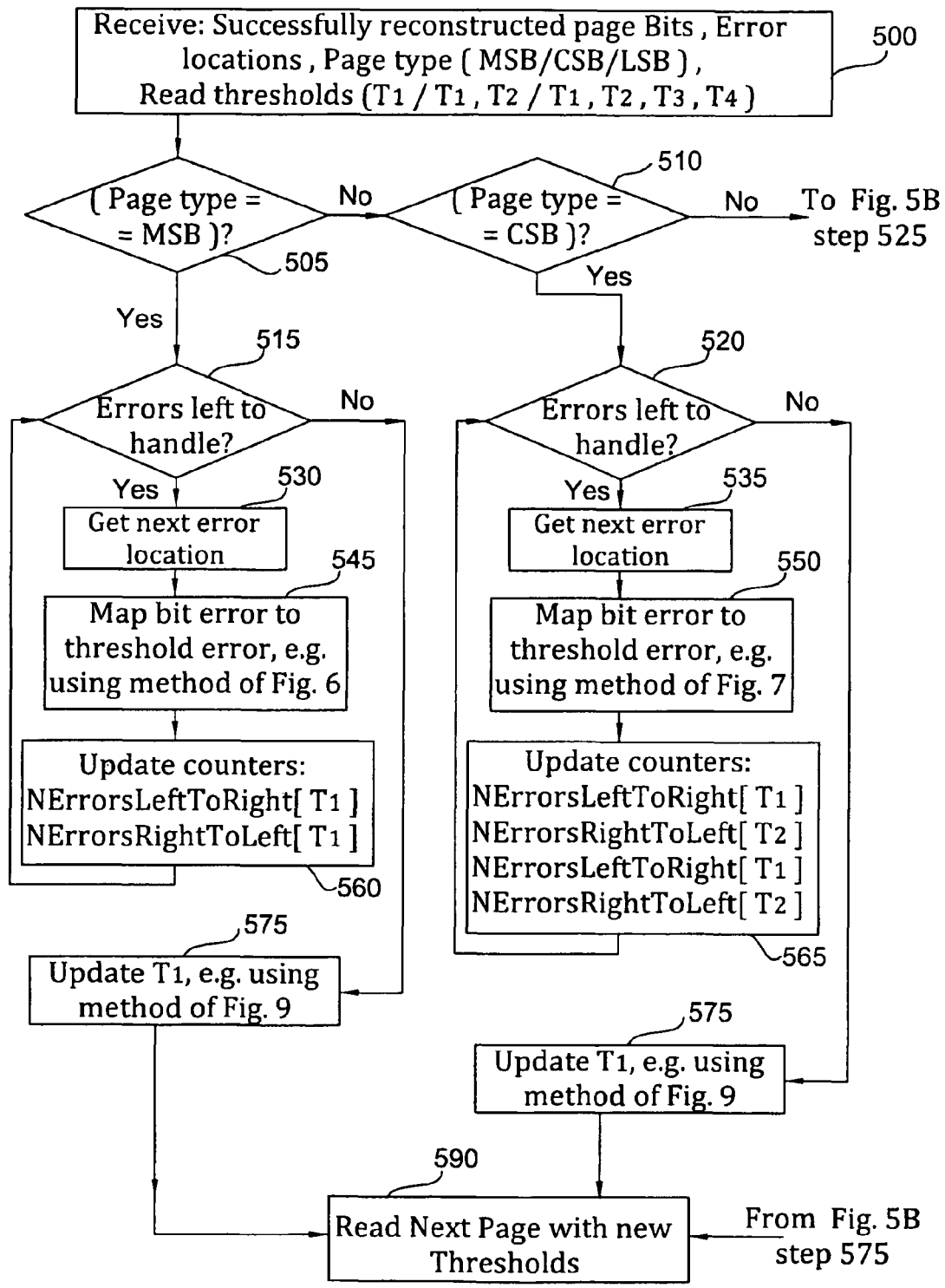
FIGS. 5A-5B, taken together, form a simplified flowchart illustration of a method for correcting reading thresholds by tracking bit error patterns, which method may for example be performed by the system of FIGS. 1-2, the method being operative according to certain embodiments of the present invention.
Figure 5B:
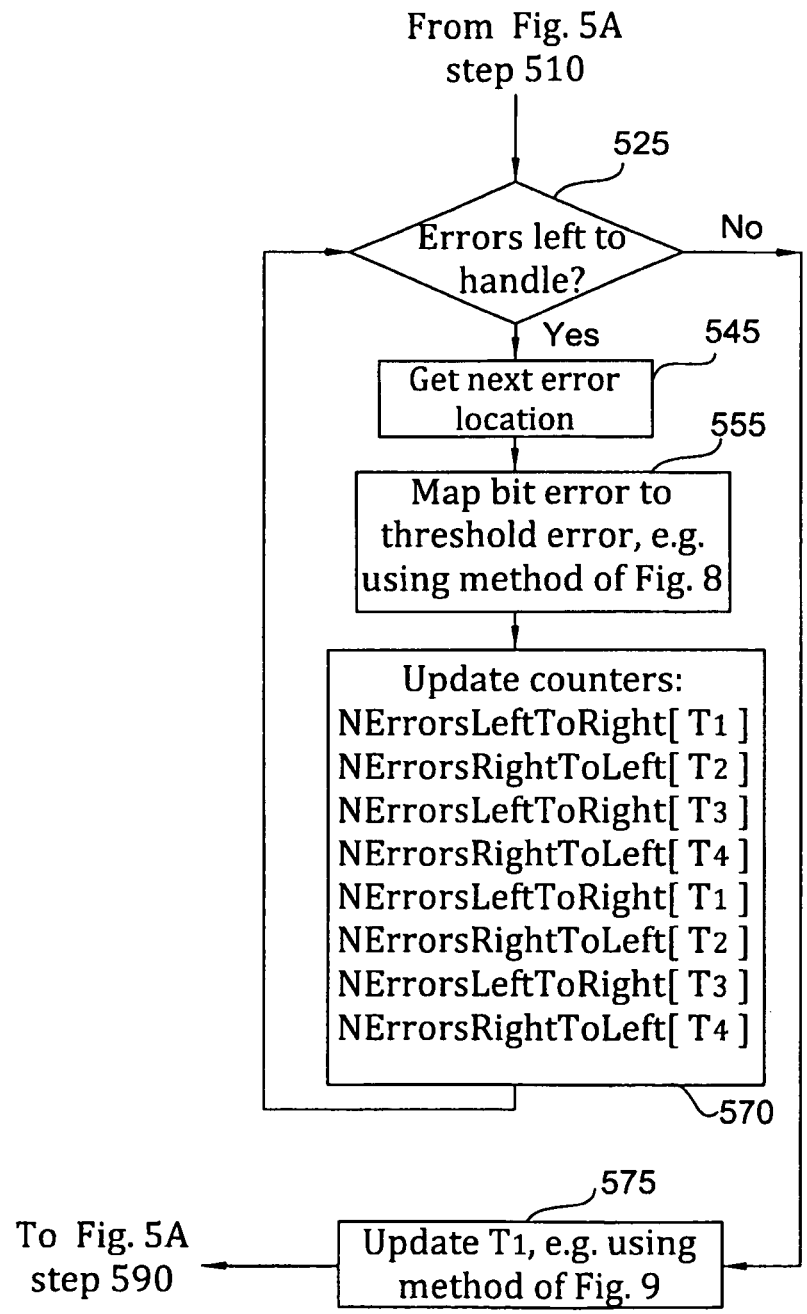

The tracking process may proceed as depicted in FIGS. 5A-5B. It is appreciated that T1-T4 in FIGS. 5A-5B are defined by FIG. 4. Once a page within a block of a flash device is successfully decoded, the corrected page bits are passed to the tracking block along with the location of the erroneous bits, the page bit type (MSB, CSB, or LSB), and the set of thresholds which was used to read the page. If the page is an MSB page, only one threshold is supplied. If the page is a CSB page, 2 thresholds are given, and finally, tracking of an LSB page uses knowledge of four detection thresholds.

Next, the process maps each bit error to a directed threshold error event and updates an appropriate counter. For each threshold, two counters are used, one counting threshold errors from left to right, and another which counts errors from right to left. Once all the errors in the page are processed, the corresponding thresholds are corrected in the appropriate direction as a function of the asymmetry in the number of threshold errors. In one embodiment, the difference between the threshold errors from left to right and from right to left is computed for every threshold, and according to the difference's sign and magnitude an appropriate quantity is either added to or subtracted from the original threshold. The procedure described in FIGS. 5A-5B is repeated for every page which is successfully decoded.

Figure 6:
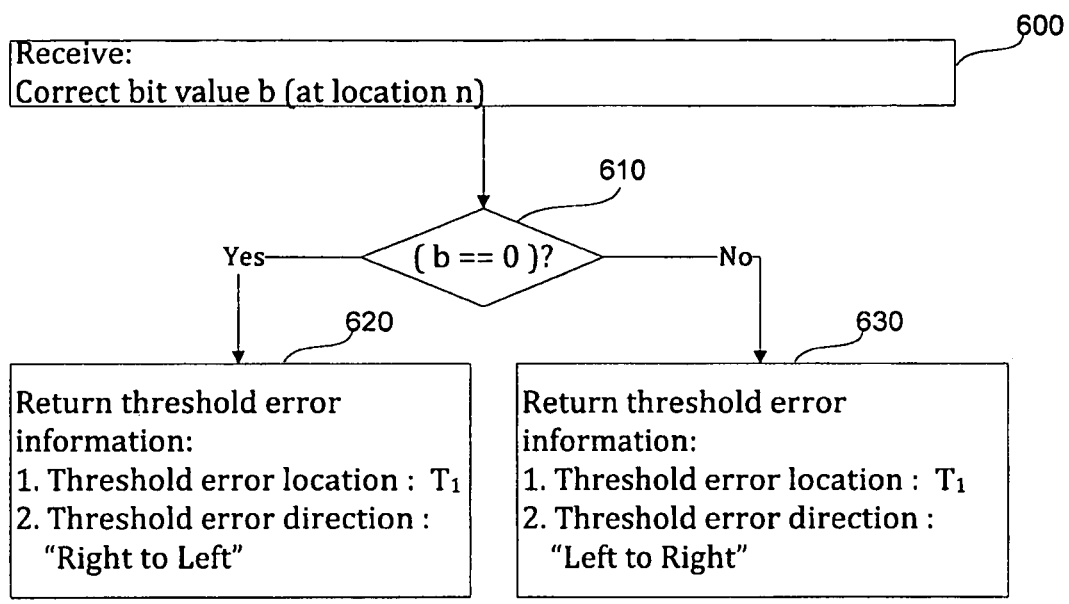
FIG. 6 is a simplified flowchart illustration of a method for performing the "bit error to threshold error" step in FIGS. 5A-5B for an MSB page, the method identifying, for each bit error, a reading threshold associated therewith and a direction thereof.
Figure 7:
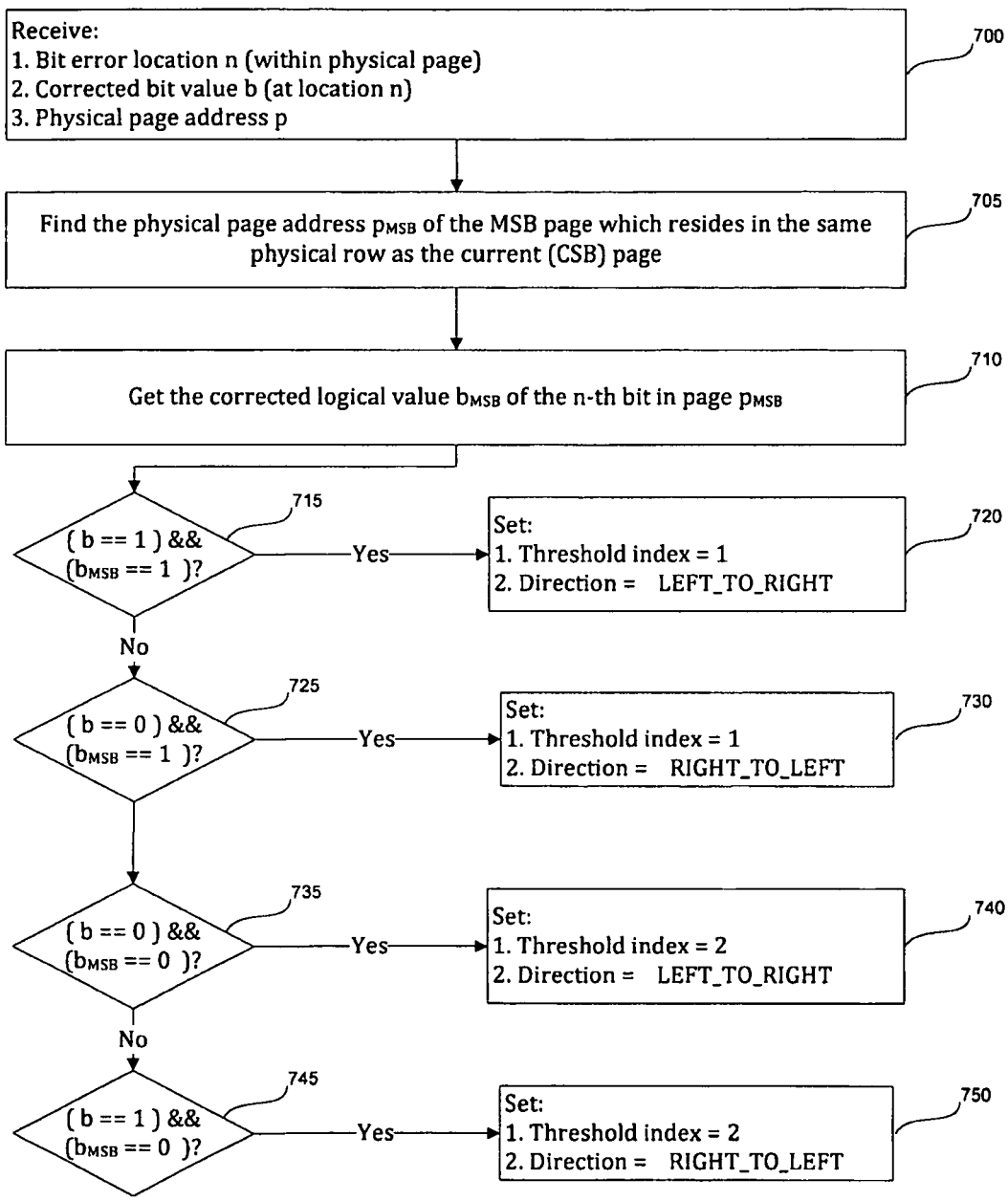
FIG. 7 is a simplified flowchart illustration of a method for performing the "bit error to threshold error" step in FIGS. 5A-5B for a CSB page, assuming, which of course need not be the case, that the cells in each page are 3-level cells (i.e. assuming for simplicity that there is only one CSB page), the method identifying, for each bit error, a reading threshold associated therewith and a direction thereof.

The way in which the bit errors are mapped to threshold error events depends on the type of page which is being tracked. For example, assuming here and throughout the present specification, that standard gray level coding is used, the mapping may be as shown in FIGS. 6-8. Specifically, FIG. 6 is a simplified flowchart illustration of a method for performing the "bit error to threshold error" step in FIGS. 5A-5B for an MSB page, the method identifying, for each bit error, a reading threshold associated therewith and a direction thereof.

FIG. 7 is a simplified flowchart illustration of a method for performing the "bit error to threshold error" step in FIGS. 5A-5B for a CSB page, assuming that the cells in each page are 3-level cells (i.e. assuming for simplicity that there is only one CSB page), the method identifying, for each bit error, a reading threshold associated therewith and a direction thereof.

Figure 8A:
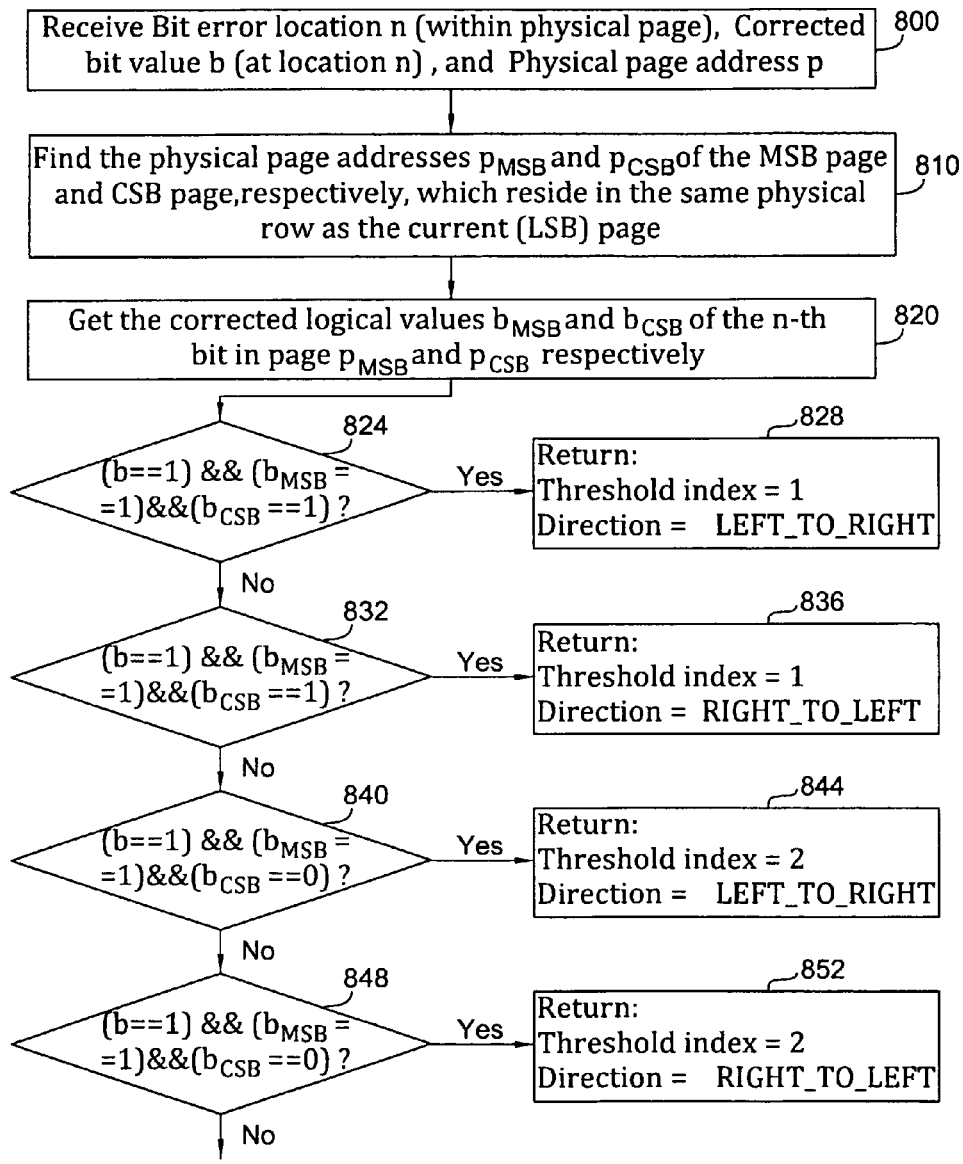
FIGS. 8A-8B, taken together, form a simplified flowchart illustration of a method for performing the "bit error to threshold error" step in FIGS. 5A-5B for an LSB page, the method identifying, for each bit error, a reading threshold associated therewith and a direction thereof.
Figure 8B:
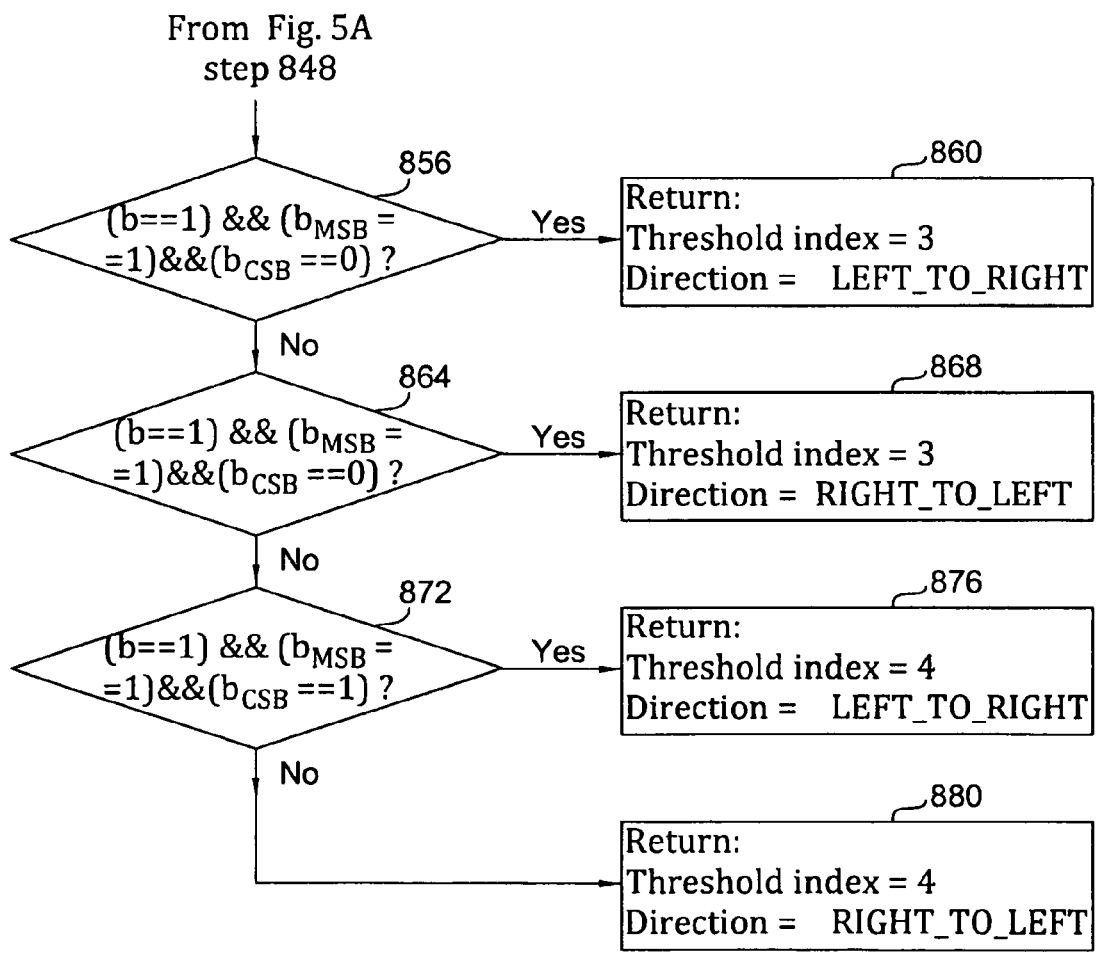
Figure 9:
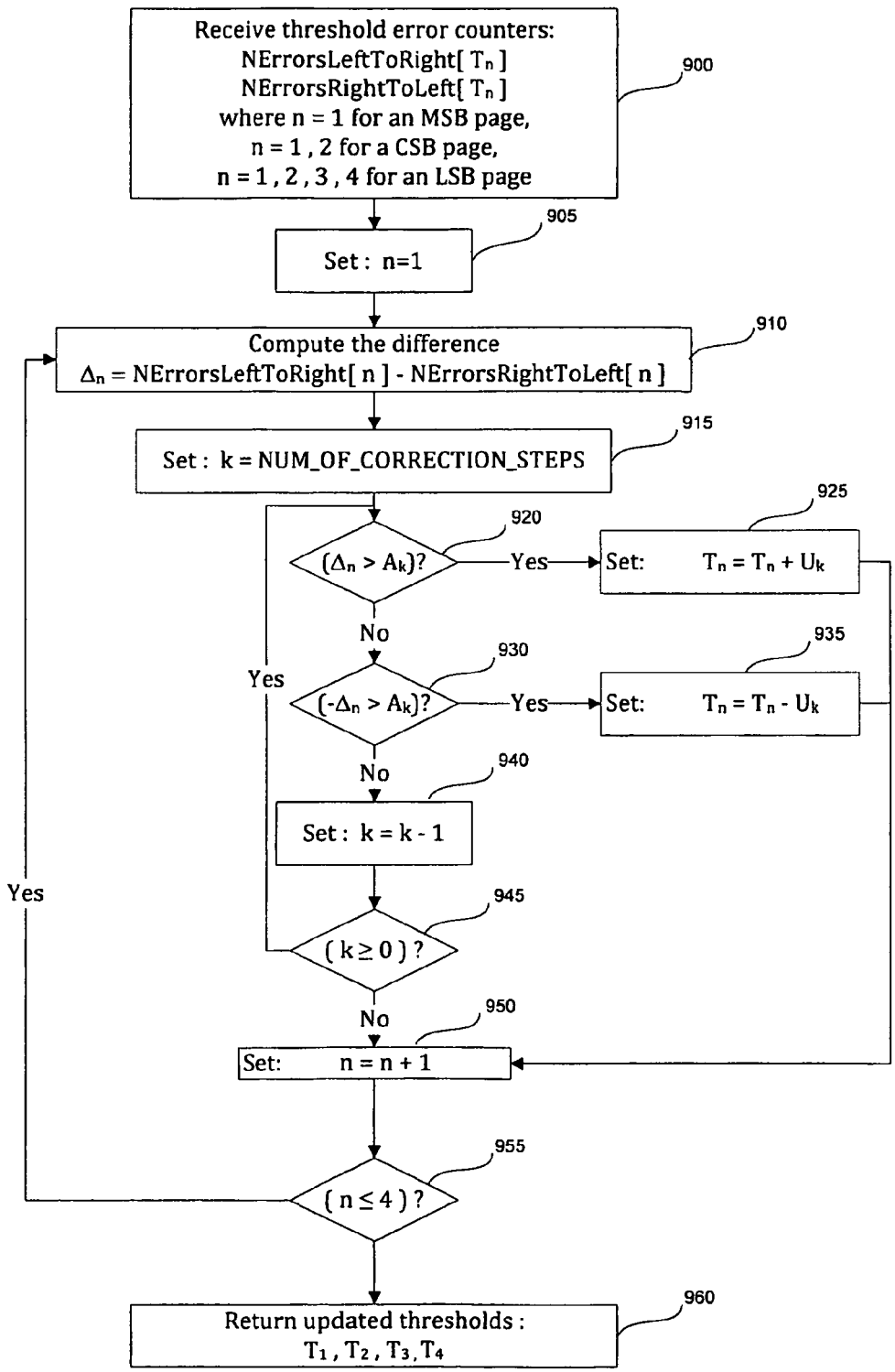
FIG. 9 is a simplified flowchart illustration of a method for performing the threshold updating step in FIGS. 5A-5B for either an MSB, CSB, or an LSB page.

FIGS. 8A-8B, taken together, form a simplified flowchart illustration of a method for performing the "bit error to threshold error" step in FIGS. 5A-5B for an LSB page, the method identifying, for each bit error, a reading threshold associated therewith and a direction thereof.

It is appreciated that in the case of an MSB page, as shown in FIG. 6, each bit error of the form 0→1 corresponds to a threshold error from right to left, and each bit error of the form 1→0 is a result of a threshold error from left to right. As shown in FIG. 7, in the case of a CSB page in a certain physical row, the mapping depends on the corresponding bit in the MSB page residing in the same physical row. For instance, a bit error event of the form 0→1 can be interpreted as a right-to-left threshold error event of threshold $T_1$, if the MSB bit equals 1, or as a left-to-right threshold error event of threshold $T_2$, if the MSB bit equals 0. Similarly, as shown in FIGS. 8A-8B, the mapping of bit errors to threshold error events for an LSB page typically comprises using knowledge of the MSB and CSB bits in the corresponding cells residing in the same physical row. Depending on the order in which the pages are written to and read from the erase sector, and depending on the mapping between logical pages and physical pages (and rows), a buffer may be used in order to store the values of the MSB and CSB pages for future tracking of CSB and LSB pages.

For instance, if the LSB page of a certain row is always written d pages after the MSB page of the same row, a buffer of length at least d may be used to guarantee that upon decoding of the LSB page, the MSB page of the same row is available.

Identification of Read Disturbs according to certain embodiments of the present invention is now described in detail.

In flash memories, the read procedure involves the application of certain voltages to the word line corresponding to the row address of the read cell as well as the bit line corresponding to the column address of the cell. These voltages are of the same kind as those which are applied during programming, only lower in magnitude. The voltage applied to the bit line may induce a small charge transfer to the floating gate. While the charge transfer which occurs in any individual read operation is limited due to the relatively low voltage applied to the bit line, the cumulative effect of many (~100,000) read operations might cause a significant charge increase in the floating gate. This phenomenon may cause cells which are in the erased state and which share the same bit line as the cell being read to become programmed. Furthermore, since all the cells along a bit line are affected by this disturb, the excessive reading of even a single page might have a deleterious effect on the entire block.

While it is possible to identify such a situation by maintaining counters for each block in the flash device and checking if for a particular block the number of read operations exceeded a certain threshold, such an approach involving a multitude of counters might be prohibitively complex in some applications.

Figure 10:
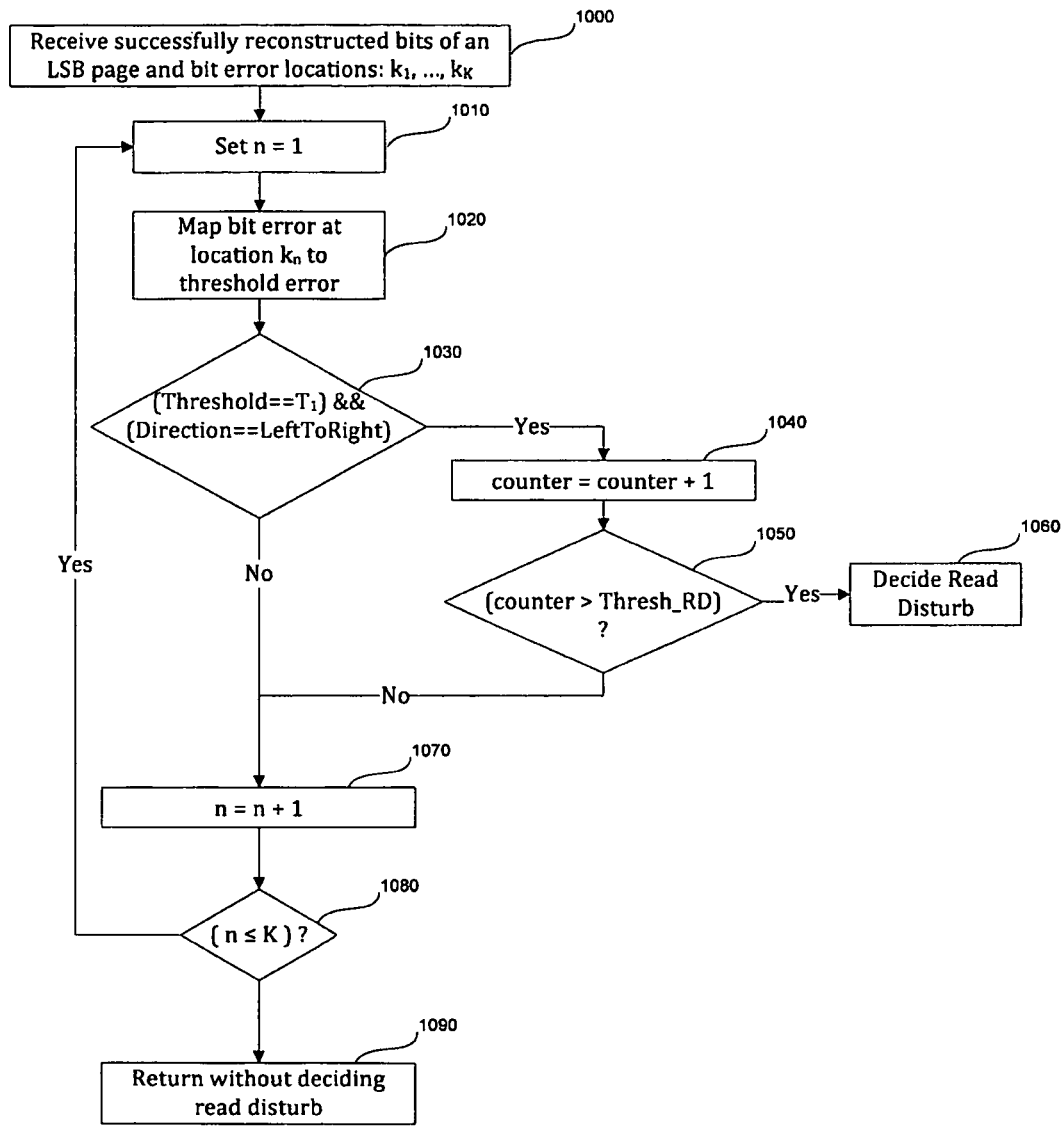
FIG. 10 is a simplified flowchart illustration of a method for read disturb identification by tracking bit error patterns, the method being operative according to certain embodiments of the present invention.

According to certain embodiments of the present invention, a determination is made as to whether a given block is reaching the state where the excessive read operations from it are about to render the data undetectable, by using the ingredients of the tracking process which was described above. Specifically, a determination may be made as to whether the cells within a particular page which are in the erased state have begun shifting to a programmed state. This can be done by associating the bit errors to their corresponding threshold errors and checking if the number of threshold errors from left to right with respect to the detection threshold closest to the erase state has increased beyond some prescribed threshold. Once the above threshold is crossed, proper measures can be taken in order to prevent the data stored in the block from being distorted beyond repair. For instance, the content of the block can be copied to another block, and the block which was identified as suffering from read disturb can be erased. An example of this procedure is shown in FIG. 10.

Any suitable action may be initiated if a read-disturb phenomenon has been detected. To give one possible example among many suitable remedial actions, the content of the block can be copied to another available block, and the block suffering from read disturb can be erased and used subsequently as an available block.

Performance trade-off considerations according to certain embodiments of the present invention are now described in detail.

In order to implement the tracking of detection thresholds as described hereinabove and the identification of blocks which suffer from read disturb also described hereinabove some previously read pages may be kept in appropriate buffers. The length of the buffer may depend on the particular order in which logical pages are mapped to physical pages within an erase sector. In some applications, the buffer might impose limitations on the scope of these applications.

Several methods by which memory consumption stemming from the buffer may be reduced, are described below. It is appreciated that the presentation of these in the context of the tracking application described above is merely by way of example and the applicability of these methods is not limited to the tracking application described above.

Dilution of Tracking Activation according to certain embodiments of the present invention is now described in detail. In some applications, the voltage variation across the rows of a block are such which employ only a few threshold corrections within the block. In the tracking method described above, the procedure for tracking the detection thresholds is activated for every page in the block. This implies that most of the times, the tracking is activated in vain.

Figure 11:
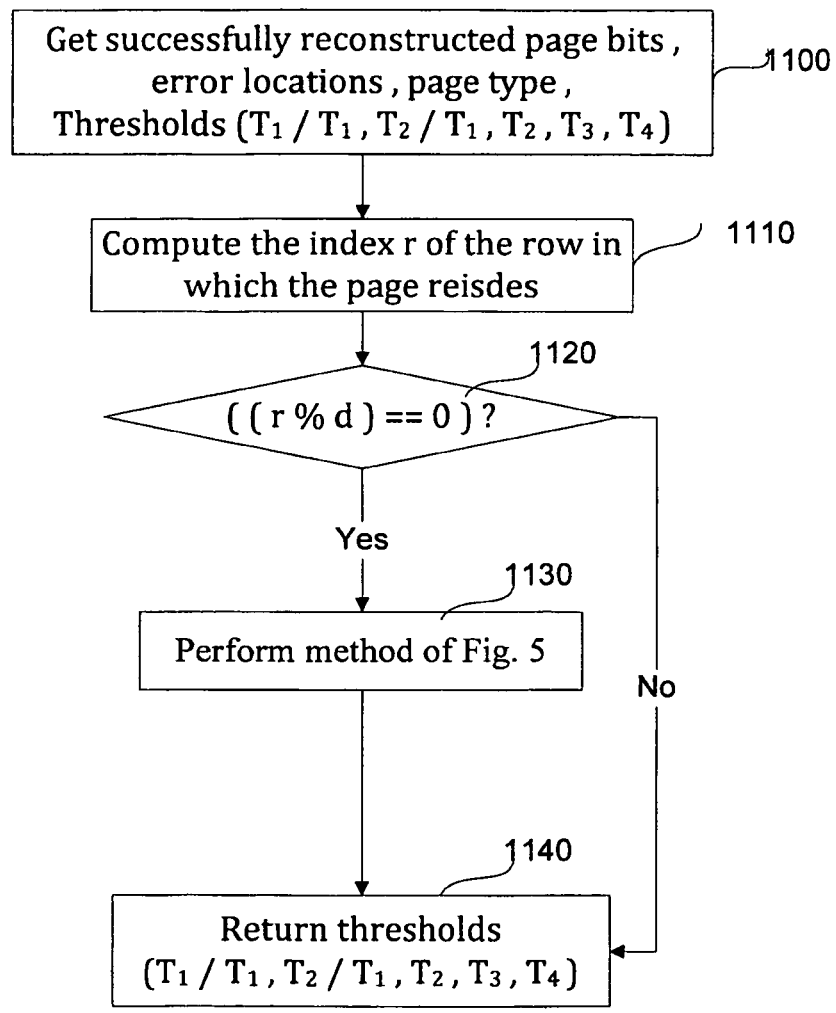
FIG. 11 is a simplified flowchart illustration of a modification of the method of FIGS. 5A-5B in which tracking activation is diluted.
Figure 12:
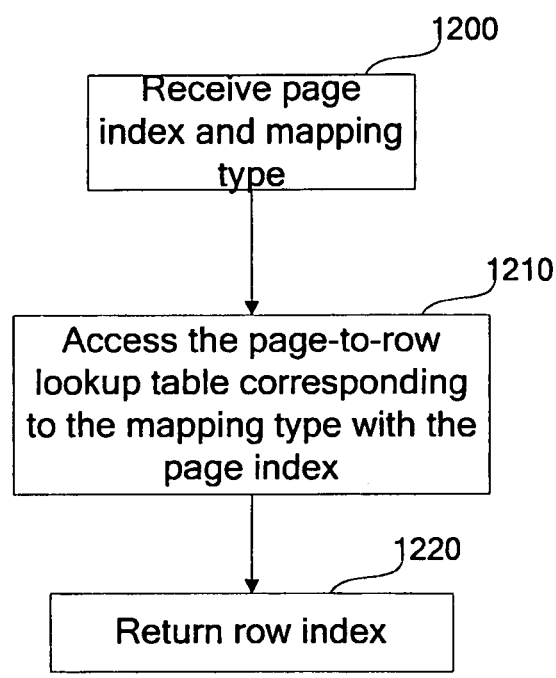
FIG. 12 is a simplified flowchart illustration of a method for accessing the page-to-row lookup table corresponding to the mapping type.
Figure 17:
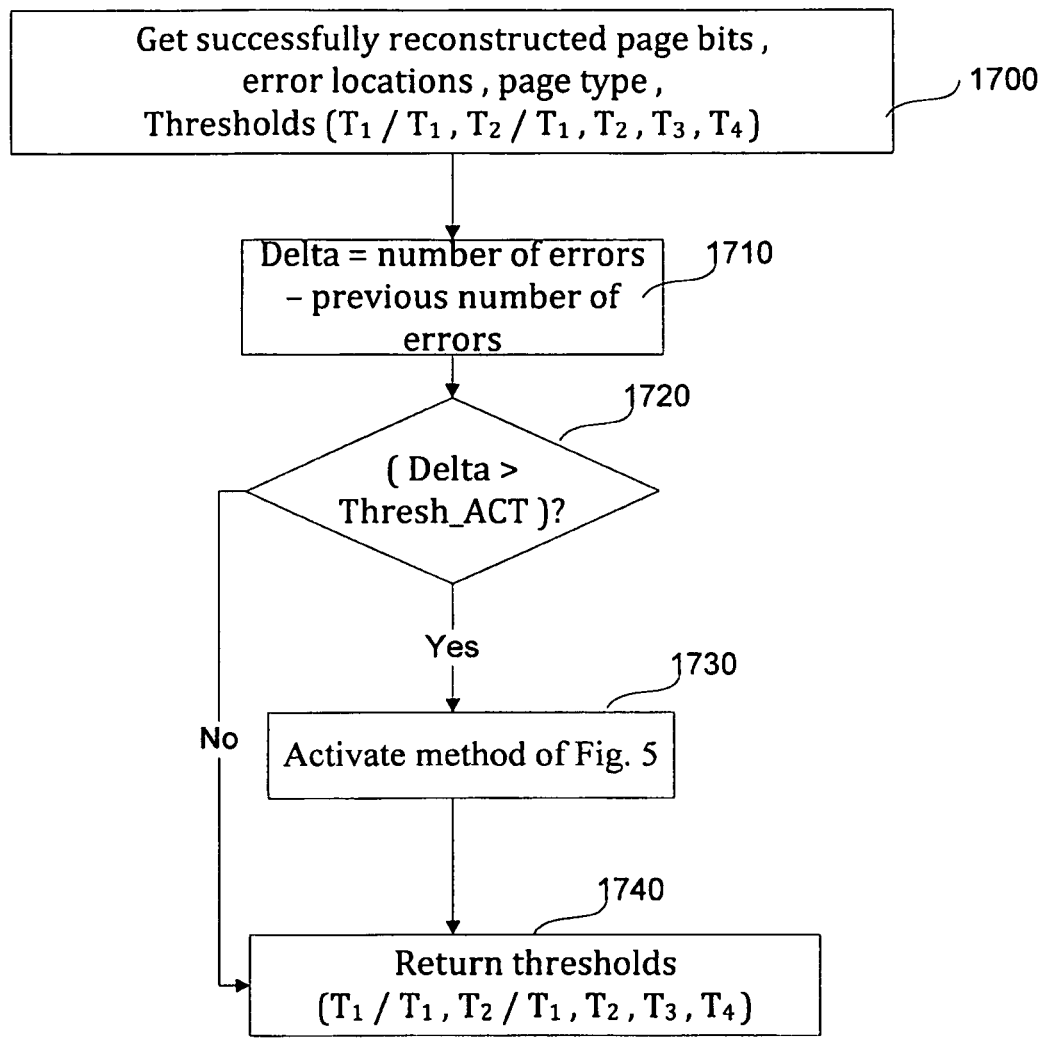
FIG. 17 is a simplified flowchart illustration of a modification of the method of FIGS. 5A-5B in which tracking activation is conditional, the method being operative according to certain embodiments of the present invention.

In certain embodiments of the present invention, the tracking is employed only on pages which lie in rows which are multiples of a certain integer values (e.g. 2, 3). The advantages of this approach are twofold. First, the processing of the bit errors is circumvented in some of the rows in the block, leading to saving in processing times. Second, the MSB and CSB pages which belong to the untracked rows need not be saved in the buffer, leading to savings in the system's memory requirements. An example of this procedure is shown in FIG. 11.

Conditional activation of tracking according to certain embodiments of the present invention is now described in detail.

In some applications, the mapping between logical pages and physical pages is such that in order to implement the tracking procedure a large number of pages is employed such as several dozen pages. It is therefore sometimes advantageous to trade-off memory resources with time resources.

In certain embodiments of this invention, the buffer is relinquished and replaced by occasional read operations from the flash. Based on the reasoning described above, it is expected that tracking will hardly be employed within the block. Tracking is typically employed when the distributions of the program levels have changed significantly with respect to the ones which were obtained last. Such a situation can be identified by checking if the total number of errors has significantly increased with respect to the previous row or page. Only if the number of errors has risen drastically, is the tracking procedure employed, and in case of tracking a CSB or a LSB page, appropriate read operations will be performed to enable association of bit errors to threshold errors. It is assumed that the scarcity of the tracking procedures employed within one block is sufficient to render the performance loss or increased time delay, due to the additional read operation, negligible.

Example implementations: Two specific implementations of the invention shown and described herein are now described, by way of example, which pertain respectively to different mappings of a sequence of logical pages numbered for convenience 0, 1, 2, . . . each including a multiplicity of data bytes such as 4 K data bytes, into an erase block including an array of physical cells arranged in physical rows numbered for convenience 0, 1, 2, . . . and physical columns. Implementation 1 pertains to a mapping scheme termed Mapping 1 and described below, and Implementation 2 pertains to a mapping scheme termed Mapping 2 and described below. It is appreciated that alternatively, any other suitable mappings may be used.

Mapping 1 comprises the following mapping scheme: A sequence of logical pages is mapped into an erase block including an array of physical multi-level e.g. 3-level cells as follows:

Logical page 0 is stored in the MSBs of cells 0, 2, 4 etc. in row 0.

Logical page 1 is stored in the MSBs of cells 1, 3, 5 etc. in row 0.

Logical page 2 is stored in the MSBs of cells 0, 2, 4, etc. in row 1.

Logical page 3 is stored in the MSBs of cells 1, 3, 5, etc. in row 1.

Logical page 4 is stored in the MSBs of cells 0, 2, 4, etc. in row 2.

Logical page 5 is stored in the MSBs of cells 1, 3, 5, etc. in row 2.

Logical page 6 is stored in the MSBs of cells 0, 2, 4, etc. in row 3.

Logical page 7 is stored in the MSBs of cells 1, 3, 5, etc. in row 3.

Logical page 8 is stored in the MSBs of cells 0, 2, 4, etc. in row 4.

Logical page 9 is stored in the MSBs of cells 1, 3, 5, etc. in row 4.

Logical page 10 is stored in the CSBs of cells 0, 2, 4, etc. in row 0.

Logical page 11 is stored in the CSBs of cells 1, 3, 5, etc. in row 0.

Logical page 12 is stored in the MSBs of cells 0, 2, 4, etc. in row 5.

Logical page 13 is stored in the MSBs of cells 1, 3, 5, etc. in row 5.

Logical page 14 is stored in the CSBs of cells 0, 2, 4, etc. in row 1.

Logical page 15 is stored in the CSBs of cells 1, 3, 5, etc. in row 1.

Logical pages 0, 2, etc. are termed herein "even pages" whereas pages 1, 3, etc. are termed herein "odd pages". For the case of erase sectors comprising 192 logical pages mapped to 32 physical rows, the mapping of pages to cells is listed in its entirety in FIG. 14.

Example implementation 1 is now described. As for tracking an MSB page, the implementation is not dependent on the mapping and is depicted in FIG. 6. As for tracking a CSB page, e.g. as shown in FIG. 7, the step 705 comprises looking in the table appearing in FIG. 16, and finding the row in which the page resides. Then, the row number is used to access the table in FIG. 14 and obtain the page number of the corresponding MSB page residing in the same row. The page itself is located in the buffer appearing in FIG. 2.

As for tracking an LSB page e.g. as shown in FIGS. 8A-8B, the step 810 comprises looking in the table appearing in FIG. 16, and finding the row in which the page resides. Then, the row number is used to access the table in FIG. 14 and obtain the page numbers of the corresponding MSB and CSB pages residing in the same row. The pages themselves are located in the buffer appearing in FIG. 2.

Mapping 2 comprises the following mapping scheme:

A sequence of logical pages is mapped into an erase block including an array of physical multi-level e.g. 3-level cells as follows:

Logical page 0 is stored in the MSBs of cells 0, 2, 4 etc. in row 0.

Logical page 1 is stored in the MSBs of cells 1, 3, 5 etc. in row 0.

Logical page 2 is stored in the CSBs of cells 0, 2, 4, etc. in row 0.

Logical page 3 is stored in the CSBs of cells 1, 3, 5, etc. in row 0.

Logical page 4 is stored in the LSBs of cells 0, 2, 4, etc. in row 0.

Logical page 5 is stored in the LSBs of cells 1, 3, 5, etc. in row 0.

Logical page 6 is stored in the MSBs of cells 0, 2, 4, etc. in row 1.

Logical page 7 is stored in the MSBs of cells 1, 3, 5, etc. in row 1.

Logical pages 0, 2, etc. are termed herein "even pages" whereas pages 1, 3, etc. are termed herein "odd pages". For the case of erase sectors comprising 192 logical pages mapped to 32 physical rows, the mapping of pages to cells is listed in its entirety in FIG. 13.

Example implementation 2 is now described. As for tracking an MSB page, the implementation is not dependent on the mapping and is depicted in FIG. 6. As for tracking a CSB page e.g. as shown in FIG. 7, step 705 comprises looking in the table appearing in FIG. 15, and finding the row in which the page resides. Then, the row number is used to access the table in FIG. 13 and obtain the page number of the corresponding MSB page residing in the same row. The page itself is located in the buffer appearing in FIG. 2. As for tracking an LSB page e.g. as shown in FIGS. 8A-8B, step 810 comprises looking in the table appearing in FIG. 15, and finding the row in which the page resides. Then, the row number is used to access the table in FIG. 13 and obtain the page numbers of the corresponding MSB and CSB pages residing in the same row. The pages themselves are located in the buffer appearing in FIG. 2.

FIG. 18 is a generalized flowchart illustration of a method of operation of the system of FIGS. 1-2, the method being operative according to certain embodiments of the present invention.

The method of FIG. 18 typically comprises some or all of the following steps, suitably ordered e.g. as shown:

Step 3010: predetermine at least one initial reading threshold.

Step 3020: perform steps 3030 and 3040 for each of at least one current logical pages.

Step 3030: generate bit error characterizing information regarding at least one corresponding bit error within at least one cell representing at least a logical portion of at least one successfully reconstructed previous logical page.

Step 3040: compute at least one row-specific reading threshold based on the bit error characterizing information and on a previous threshold initially comprising the initial threshold and subsequently comprising a row-specific reading threshold computed for a successfully reconstructed previous logical page.

Step 3050: When steps 3030 and 3040 have been performed for a set of current logical pages, step 3050 is performed, involving reading at least a portion of the current logical page using the at least one row-specific reading threshold.

Figure 19:
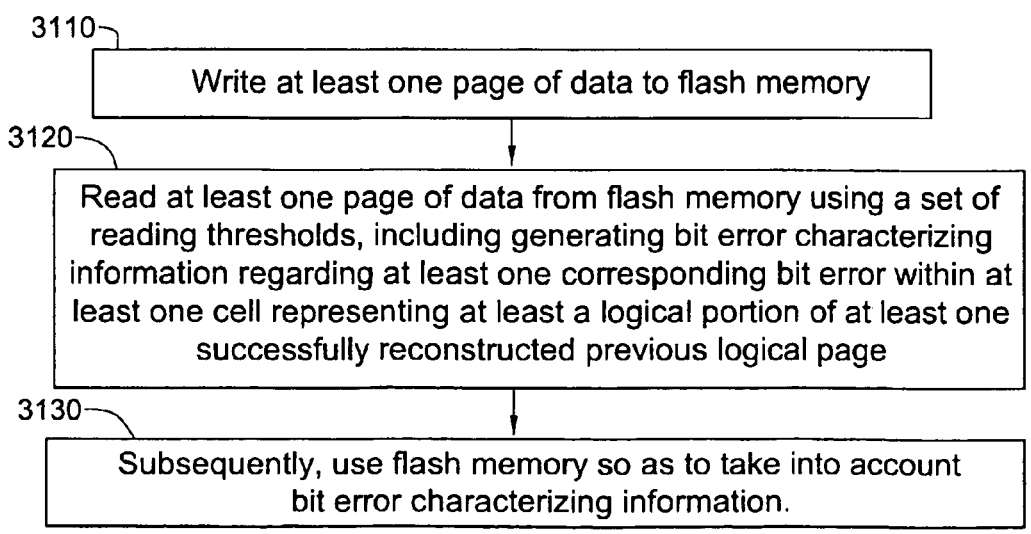
FIG. 19 is a simplified flowchart illustration of a method for using flash memory to store data, the method being operative in accordance with certain embodiments of the present invention.

FIG. 19 is a simplified flowchart illustration of a method for using flash memory to store data, the method being operative in accordance with certain embodiments of the present invention. The method of FIG. 19 typically comprises some or all of the following steps, suitably ordered e.g. as shown:

Step 3110: Write at least one page of data to flash memory

Step 3120: Read at least one page of data from flash memory using a set of reading thresholds, including generating bit error characterizing information regarding at least one corresponding bit error within at least one cell representing at least a logical portion of at least one successfully reconstructed previous logical page Step 3130: Subsequently, use flash memory so as to take into account bit error characterizing information.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or clients for using such; and hardware which performs any or all of the steps of any of the methods shown and described herein, in any suitable order, either alone or in conjunction with software.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix' HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Example of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above. The present invention may for example interface with or modify, as per any of the embodiments described herein, one, some or all of the above components.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

The invention claimed is:

1. A method for generating a set of at least one row-specific reading threshold, the method comprising:
predetermining at least one initial reading threshold;
performing the following steps for at least one current logical page:
generating bit, error characterizing information regarding at least one corresponding bit error within at least one flash memory cell representing at least a logical portion of at least one successfully reconstructed previous logical page; and
computing each row-specific reading threshold out of at least one row-specific reading threshold based on said bit error characterizing information and on a previous threshold initially comprising an initial threshold out of the at least one initial reading threshold and subsequently comprising a row-specific reading threshold computed for a successfully reconstructed previous logical page; and
reading at least a portion of said current logical page, wherein the reading comprises comparing gate voltages of flash memory cells representing the at least portion of said current logical page to said at least one row-specific reading threshold.

2. The method according to claim 1 wherein said bit error characterizing information comprises identification of a reading threshold associated with the bit error.

3. The method according to claim 1 wherein said bit error characterizing information comprises a direction of the bit error.

4. The method according to claim 1 wherein a first number of threshold errors whose direction, with respect to said previous threshold, is from left to right is compared to a second number of threshold errors whose direction, with respect to said previous threshold, is from right to left, wherein the row-specific reading threshold depends upon at least one of the sign and magnitude of the difference between said first and second numbers of threshold errors.

5. The method according to claim 1 and also comprising: selecting a subset of rows within said erase sector; and identifying a set of logical pages residing within said subset of rows; and performing said generating, computing and reading for said set of logical pages and for less than all pages in said erase sector.

6. The method according to claim 5 and wherein said generating, computing and reading are performed only for said set of logical pages.

7. The method according to claim 1 wherein said previous threshold is corrected only if a number of bit errors per page is in a process of change of at least a predetermined magnitude.

8. The method according to claim 7 wherein said previous threshold is corrected only if a difference between a number of bit errors encountered during reconstruction of said current page and a number of bit errors occurring during reconstruction of at least one previous page is larger than a predetermined number.

9. The method according to claim 1 wherein said generating is performed for at least one CSB page residing in a row corresponding to an MSB page also residing in said row, based at least partly on values read from said MSB page.

10. The method according to claim 9 wherein said generating performed for said CSB page is based at least partly on values read on-the-fly from said MSB page.

11. The method according to claim 9 wherein said generating performed for said CSB page is based at least partly on stored values previously read from said MSB page.

12. The method according to claim 1 wherein said generating is performed for an LSB page residing in a row corresponding to an MSB and at least one CSB page also residing in said row, based at least partly on values read from at least one of said MSB and CSB pages.

13. The method according to claim 12 wherein said generating performed for said LSB page is based at least partly on values read on-the-fly from at least one of said MSB and CSB pages.

14. The method according to claim 12 wherein said generating performed for said LSB page is based at least partly on stored values previously read from at least one of said MSB and CSB pages.

15. A method for using flash memory to store data, the method comprising:
writing at least one page of data to said flash memory;
reading said at least one page of data from said flash memory using a set of reading thresholds;
generating bit error characterizing information regarding at least one corresponding bit error within at least one cell representing at least a logical portion of at least one successfully reconstructed previous logical page; and detecting portions of said flash memory which suffer from read-disturb phenomenon based on said bit error characterizing information.

16. The method according to claim 15 wherein said bit error characterizing information comprises identification of a reading threshold which is associated with the bit error.

17. The method according to claim 15 wherein said bit error characterizing information comprises a direction of the bit error.

18. The method according to claim 15 wherein said detecting comprises detecting an overly large number of bit errors whose source is a reading threshold which is closest, within said set of reading thresholds, to zero voltage, and whose direction is from left to right.

19. A system for generating a set of at least one row-specific reading threshold for reading at least portions of pages of data within an erase sector of a flash memory device, the system comprising:

apparatus for predetermining at least one initial reading threshold;

a bit error analyzer operative, for at least one current logical page, to generate bit error characterizing information regarding at least one corresponding bit error within at least one cell of the flash memory device representing at least a logical portion of at least one successfully reconstructed previous logical page;

a bit error-based threshold generator operative to compute each row-specific reading threshold out of at least one row-specific reading threshold based on said bit error characterizing information and on a previous threshold initially comprising an initial threshold out of the at least one initial thresholds and subsequently comprising a row-specific reading threshold computed for a successfully reconstructed previous logical page; and a flash memory cell reader operative to read at least a portion of said current logical page by comparing gate voltages of flash memory cells representing the at least portion of said current logical page to said at least one row-specific reading threshold.

20. A system for using flash memory to store data, the system comprising:

apparatus for writing in flash memory operative to write at least one page of data to the flash memory;

a bit error characterizing reader operative to read said at least one page of data from said flash memory using a set of reading thresholds, and to generate bit error characterizing information regarding at least one corresponding bit error within at least one cell representing at least a logical portion of at least one successfully reconstructed previous logical page; and a bit error-based controller operative to detect portions of said flash memory which suffer from read-disturb phenomenon based on said bit error characterizing information.

* * * * *